(12) United States Patent
Porreca et al.

(10) Patent No.: US 8,477,498 B2
(45) Date of Patent: Jul. 2, 2013

(54) CONDUCTION-COOLED APPARATUS AND METHODS OF FORMING SAID APPARATUS

(75) Inventors: Paul J. Porreca, Marlborough, MA (US); Todd P. Maille, Dracut, MA (US); Michael R. Palis, Lancaster, MA (US)

(73) Assignee: Curtiss-Wright Controls, Inc., Charlotte, NC (US)

( * ) Notice: Subject to any disclaimer, the term of this patent is extended or adjusted under 35 U.S.C. 154(b) by 283 days.

(21) Appl. No.: 13/071,970

(22) Filed: Mar. 25, 2011

(65) Prior Publication Data
US 2011/0267776 A1    Nov. 3, 2011

Related U.S. Application Data

(60) Provisional application No. 61/317,465, filed on Mar. 25, 2010, provisional application No. 61/420,097, filed on Dec. 6, 2010.

(51) Int. Cl.
*H05K 7/20* (2006.01)
(52) U.S. Cl.
USPC ........... 361/704; 361/696; 361/708; 361/715; 361/719
(58) Field of Classification Search
USPC ....................................................... 361/708
See application file for complete search history.

(56) References Cited

U.S. PATENT DOCUMENTS

| | | | | |
|---|---|---|---|---|
| 3,865,183 A | * | 2/1975 | Roush .......................... | 165/80.4 |
| 4,777,561 A | * | 10/1988 | Murphy et al. ............... | 361/700 |
| 4,849,858 A | * | 7/1989 | Grapes et al. ................ | 361/708 |
| 4,963,414 A | | 10/1990 | LeVasseur et al. | |
| 5,057,468 A | * | 10/1991 | Adams ............................. | 502/1 |
| 5,309,315 A | * | 5/1994 | Naedel et al. ................. | 361/704 |
| 5,424,916 A | * | 6/1995 | Martin .......................... | 361/698 |
| 5,506,751 A | | 4/1996 | Chatel | |
| 5,566,752 A | | 10/1996 | Arnold et al. | |
| 5,766,691 A | | 6/1998 | Arnold et al. | |
| 5,825,261 A | * | 10/1998 | Goutelard ..................... | 333/139 |
| 5,825,624 A | | 10/1998 | Arnold et al. | |
| 5,949,650 A | * | 9/1999 | Bulante et al. ................ | 361/704 |
| 5,975,201 A | | 11/1999 | Roberts et al. | |
| 6,026,565 A | * | 2/2000 | Giannatto et al. ............. | 29/830 |

(Continued)

FOREIGN PATENT DOCUMENTS

WO    0055951    9/2000

OTHER PUBLICATIONS

International Search Report dated Dec. 13, 2011 issued in corresponding International application No. PCT/US2011/029942.

*Primary Examiner* — Gregory Thompson
(74) *Attorney, Agent, or Firm* — Onello & Mello, LLP

(57) ABSTRACT

A circuit card enclosure comprises a backplane including a plurality of connectors. First and second conduction rails are thermally coupled to a heat exchanger, the first and second conduction rails each comprising an inner body at least partially encapsulated by an outer body. The inner body comprises a thermally conductive material. The outer body comprises a structural material. Card slots of the circuit card enclosure are defined between opposed card channels of the first and second conduction rails. Each card slot is constructed and arranged to register an inserted circuit card with at least one of the connectors, the card channels including a thermally conductive region constructed and arranged to thermally interface with a thermal frame of an inserted circuit card, the thermally conductive region of the card channels being thermally coupled to the inner body of the conduction rail.

38 Claims, 36 Drawing Sheets

U.S. PATENT DOCUMENTS

| | | |
|---|---|---|
| 6,054,198 A | 4/2000 | Bunyan et al. |
| 7,071,408 B2 | 7/2006 | Garner |
| 7,256,991 B2 | 8/2007 | Sullivan |
| 7,460,367 B2 * | 12/2008 | Tracewell et al. ....... 361/679.48 |
| 7,633,757 B2 * | 12/2009 | Gustine et al. ................ 361/714 |
| 7,742,307 B2 | 6/2010 | Ellsworth et al. |
| 2004/0191542 A1 | 9/2004 | McLeod et al. |
| 2008/0164008 A1 | 7/2008 | Austin et al. |
| 2008/0218980 A1 | 9/2008 | Tracewell et al. |
| 2010/0027220 A1 | 2/2010 | Hughes et al. |

* cited by examiner

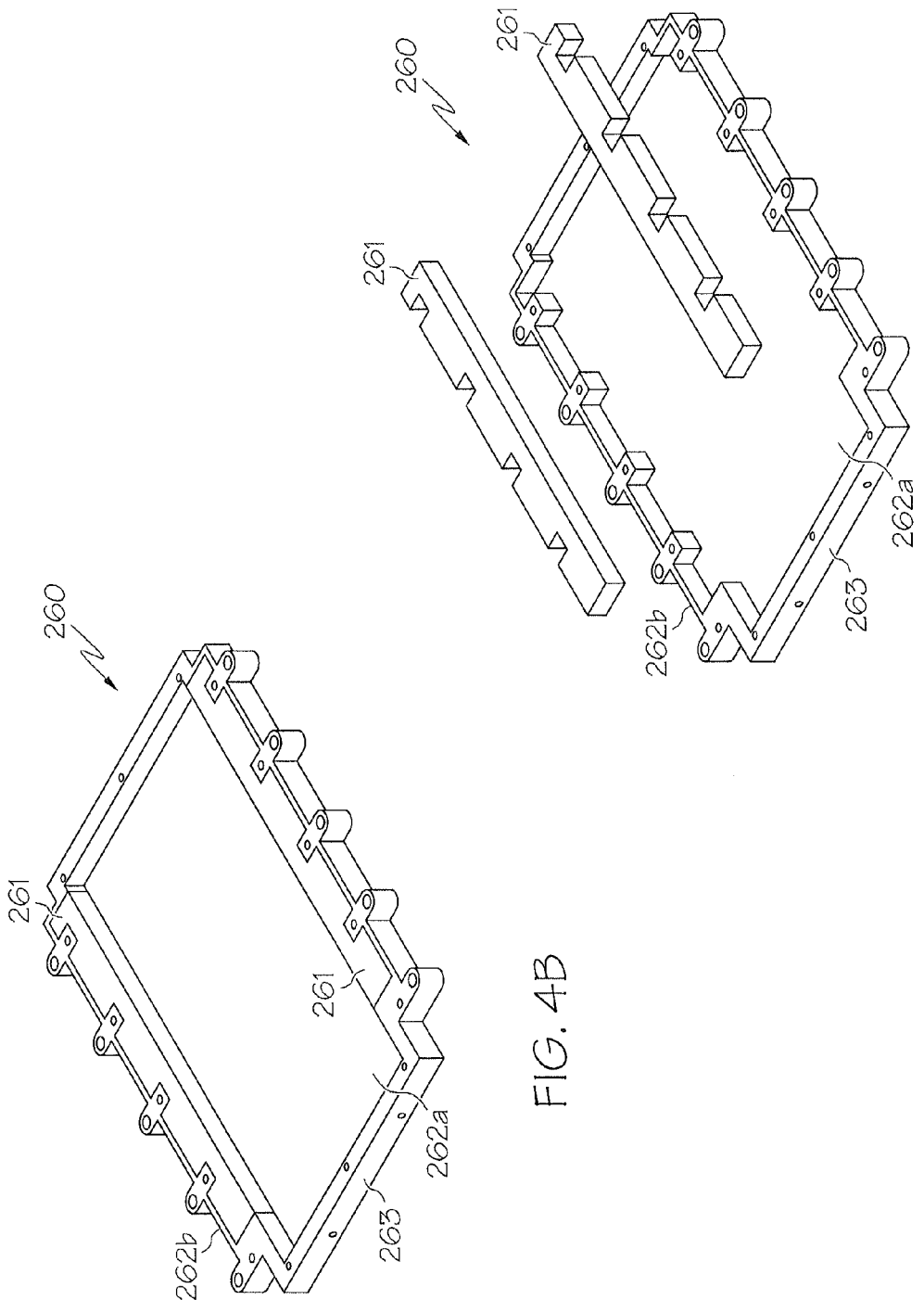

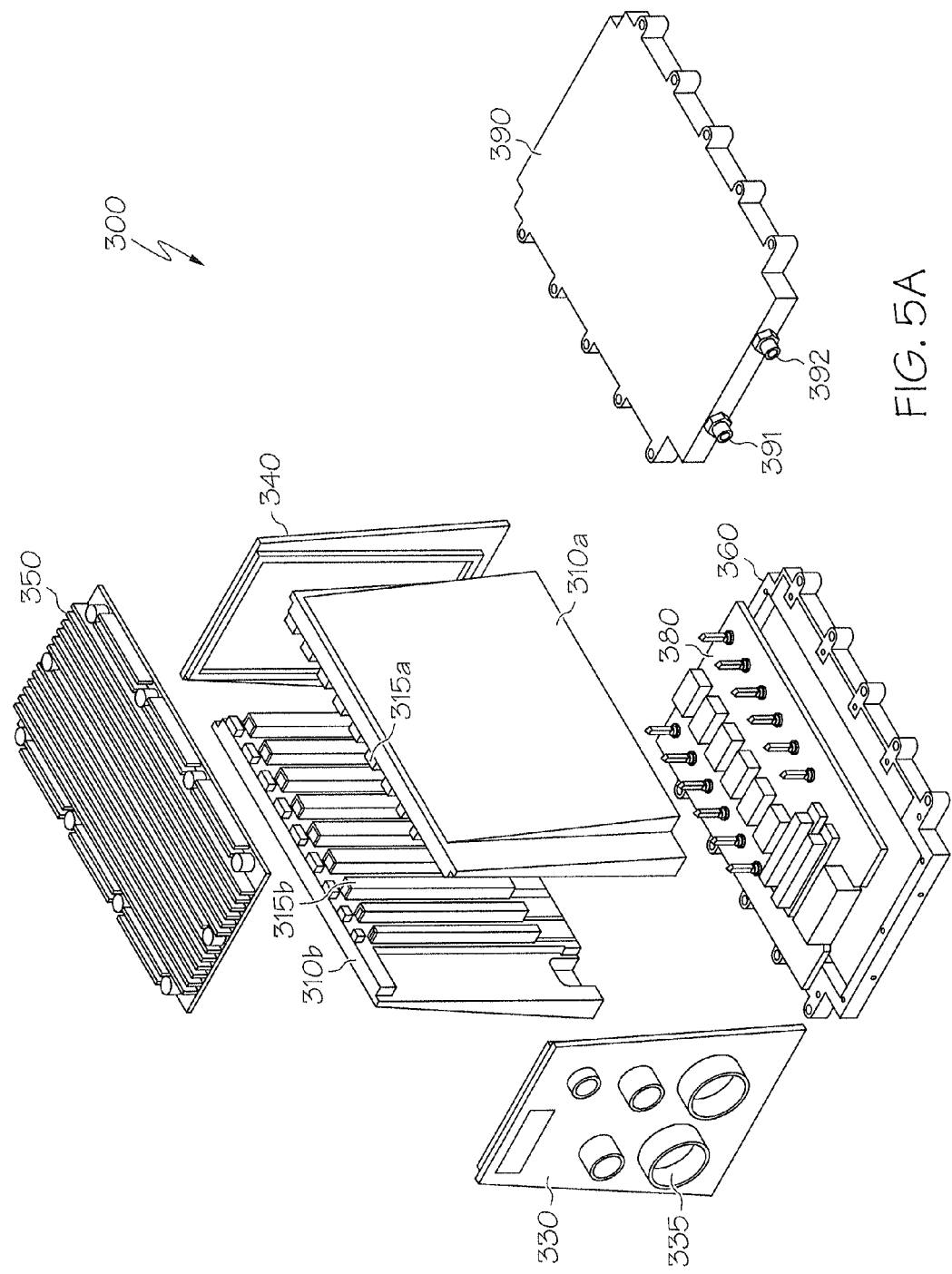

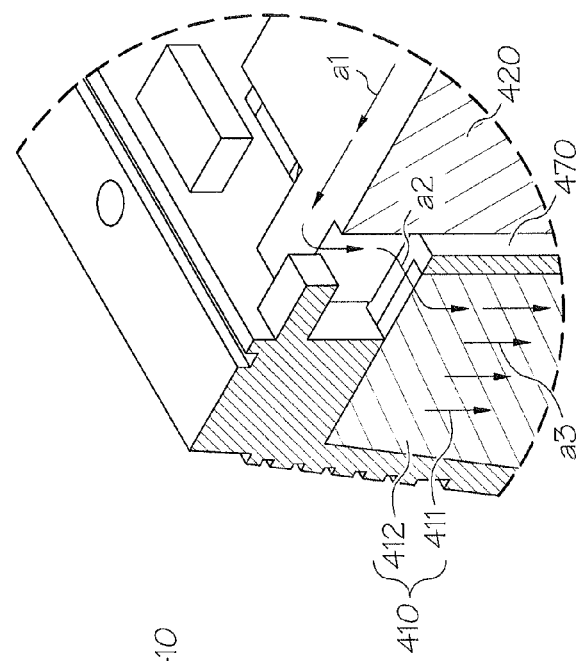
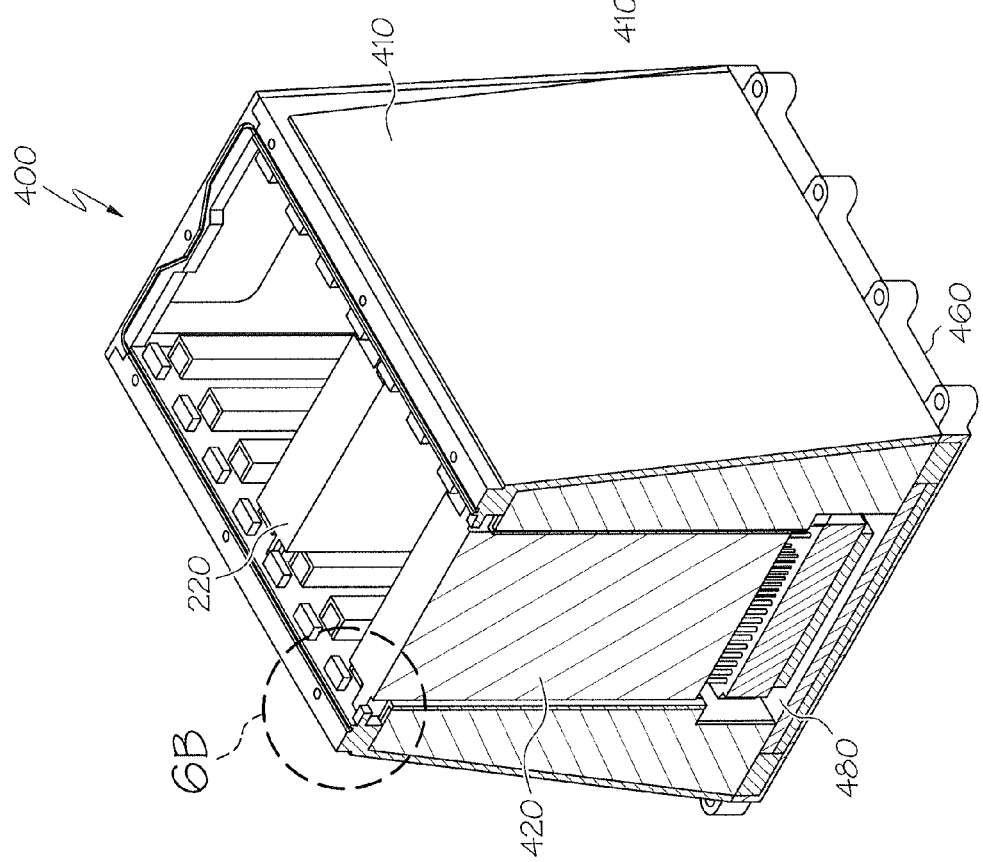
FIG. 6B
FIG. 6A

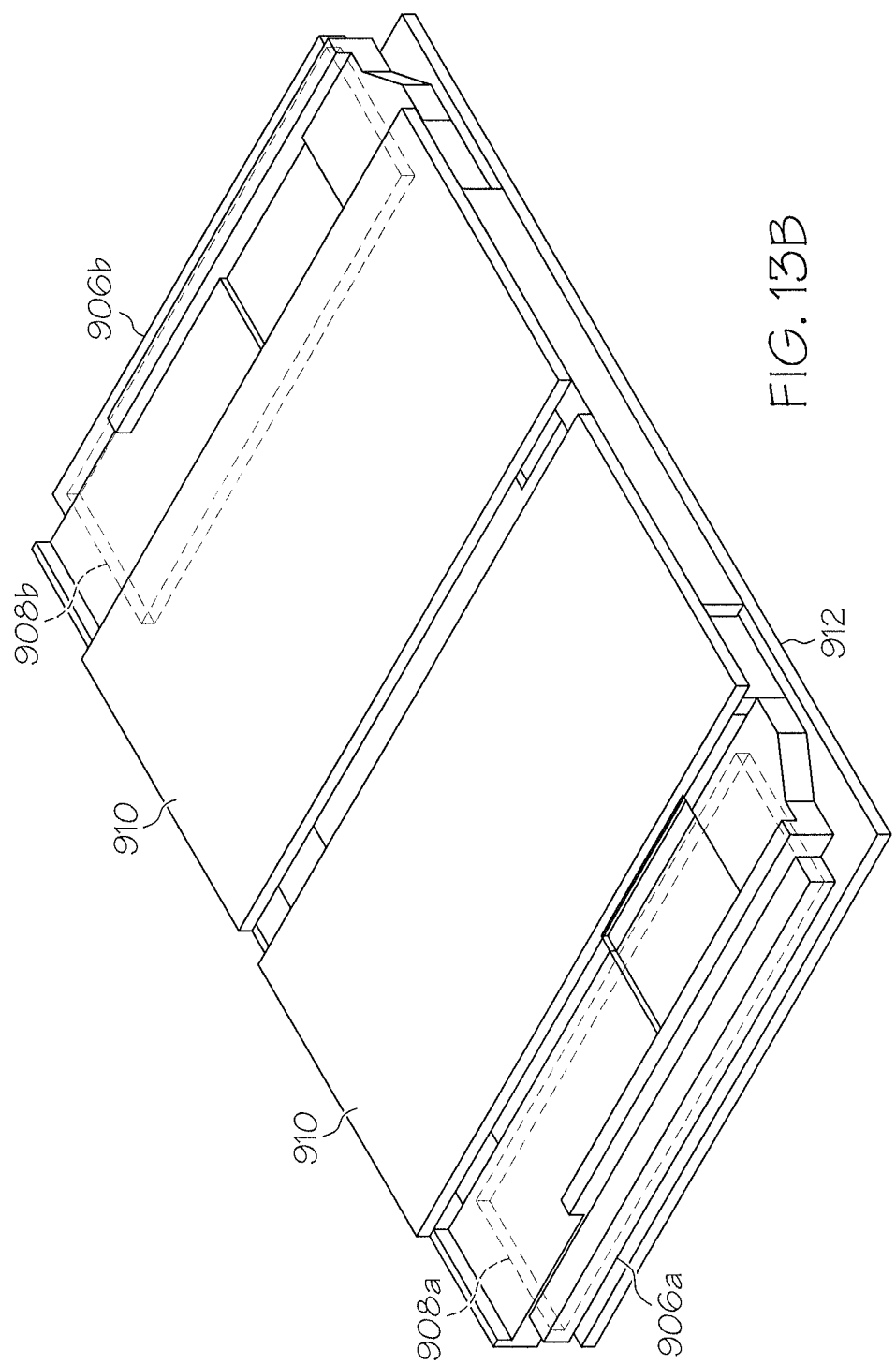

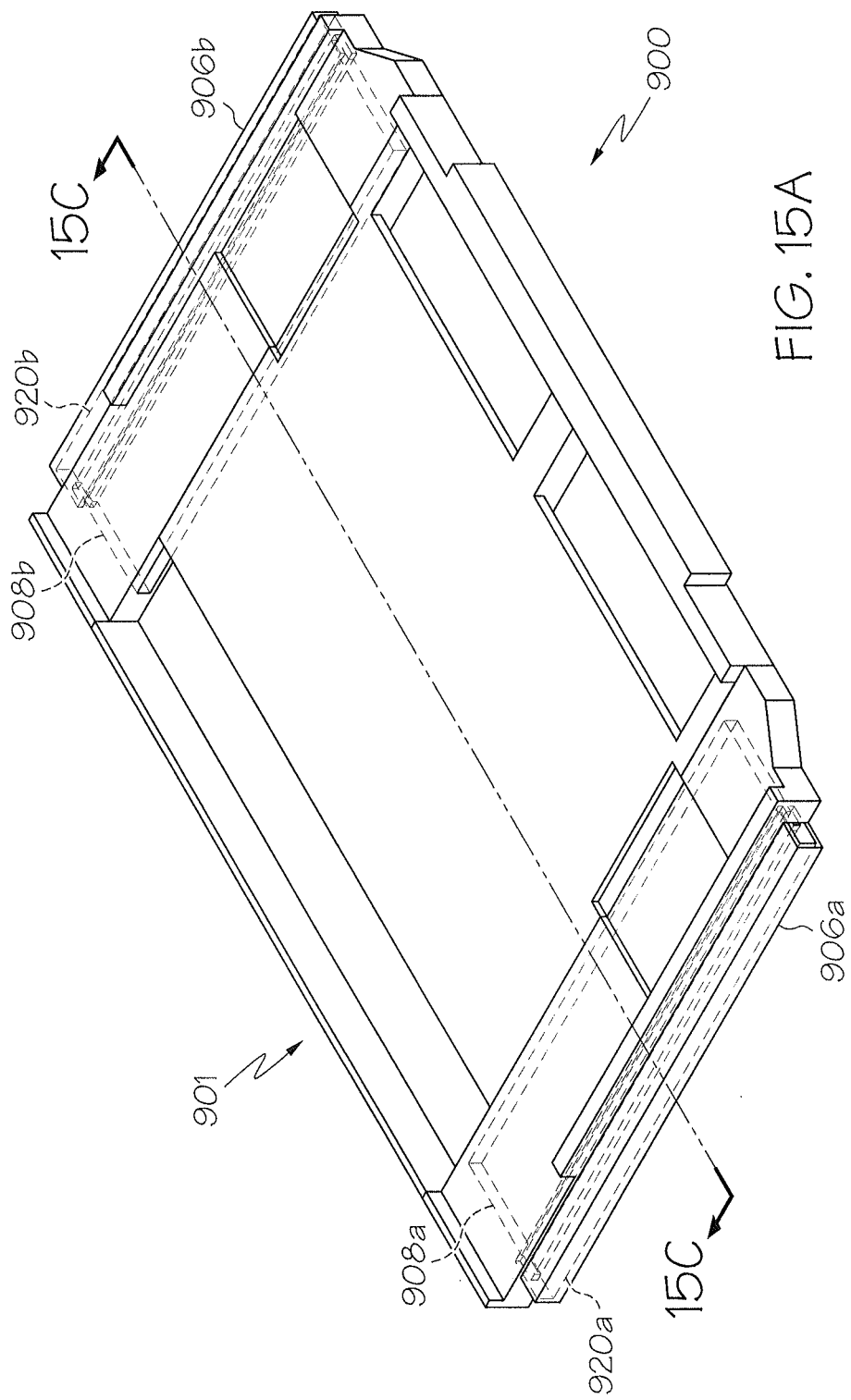

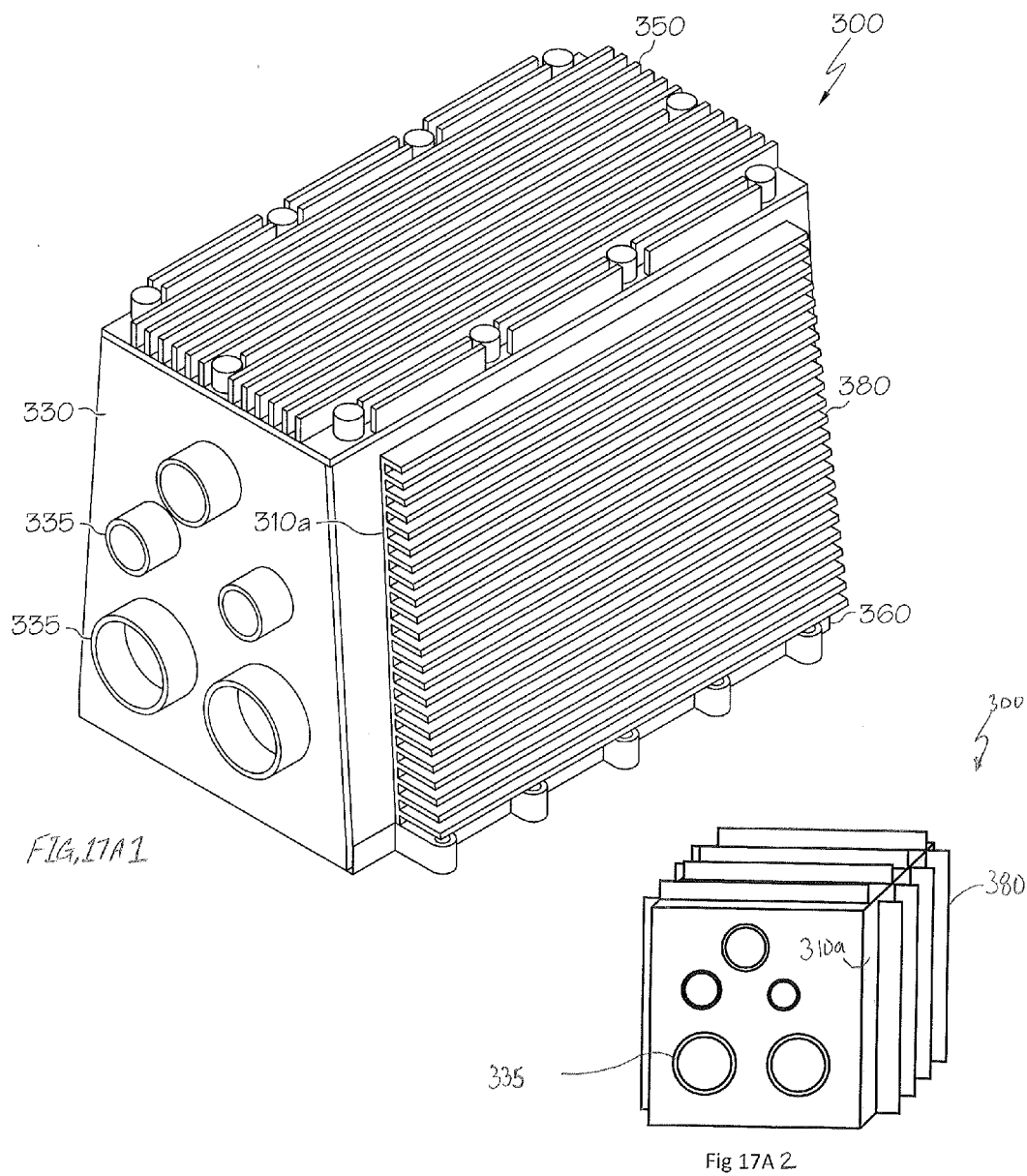

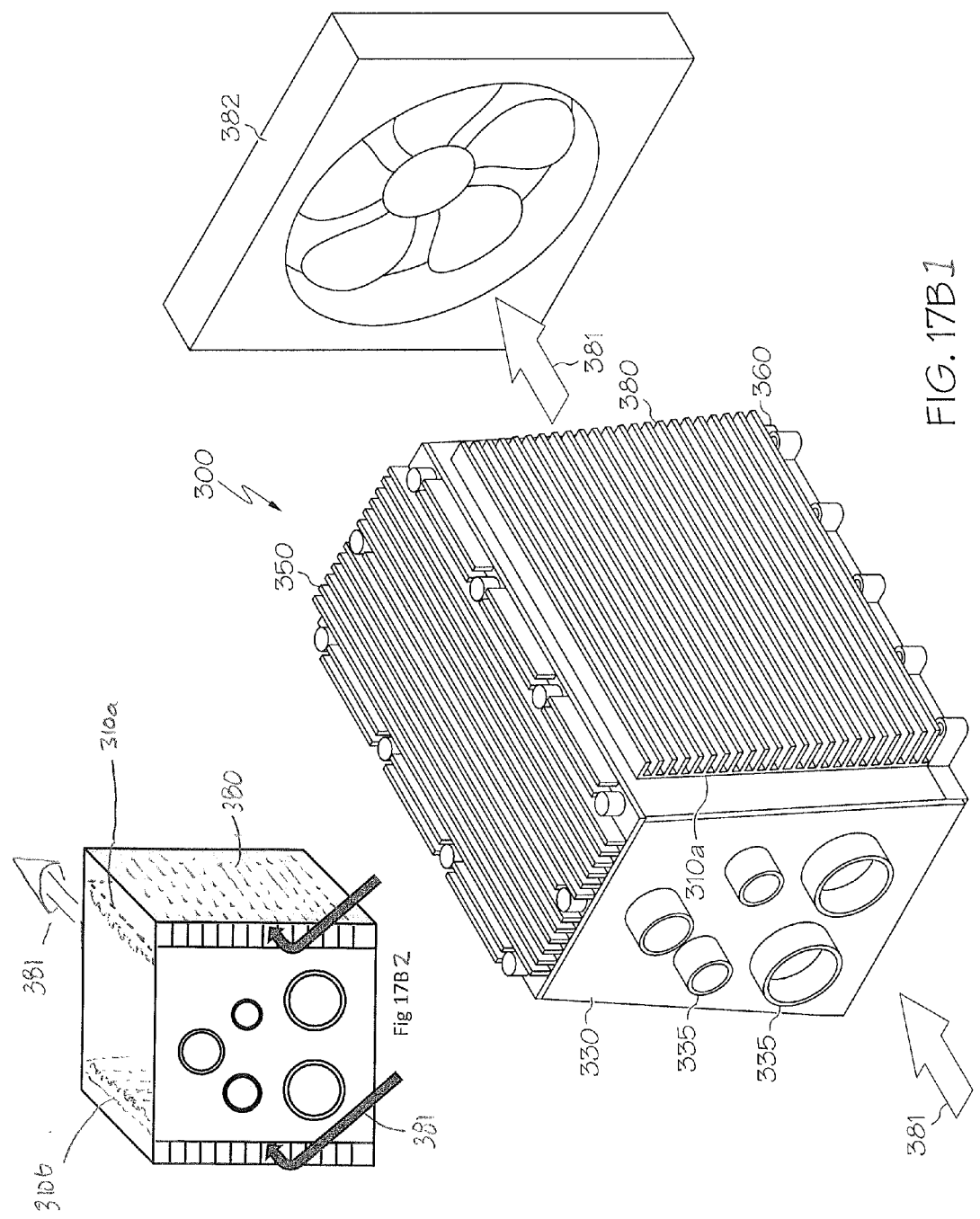

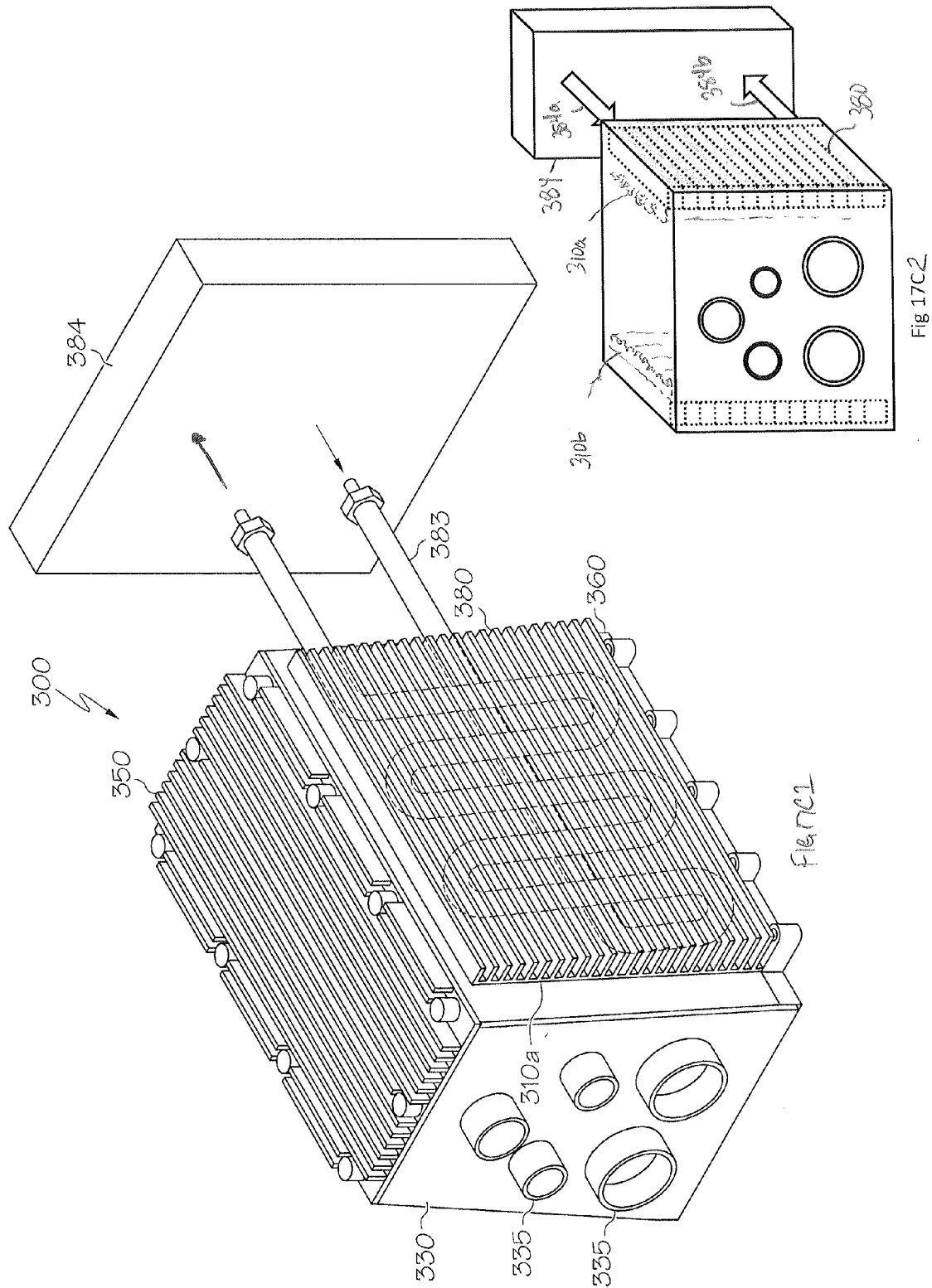

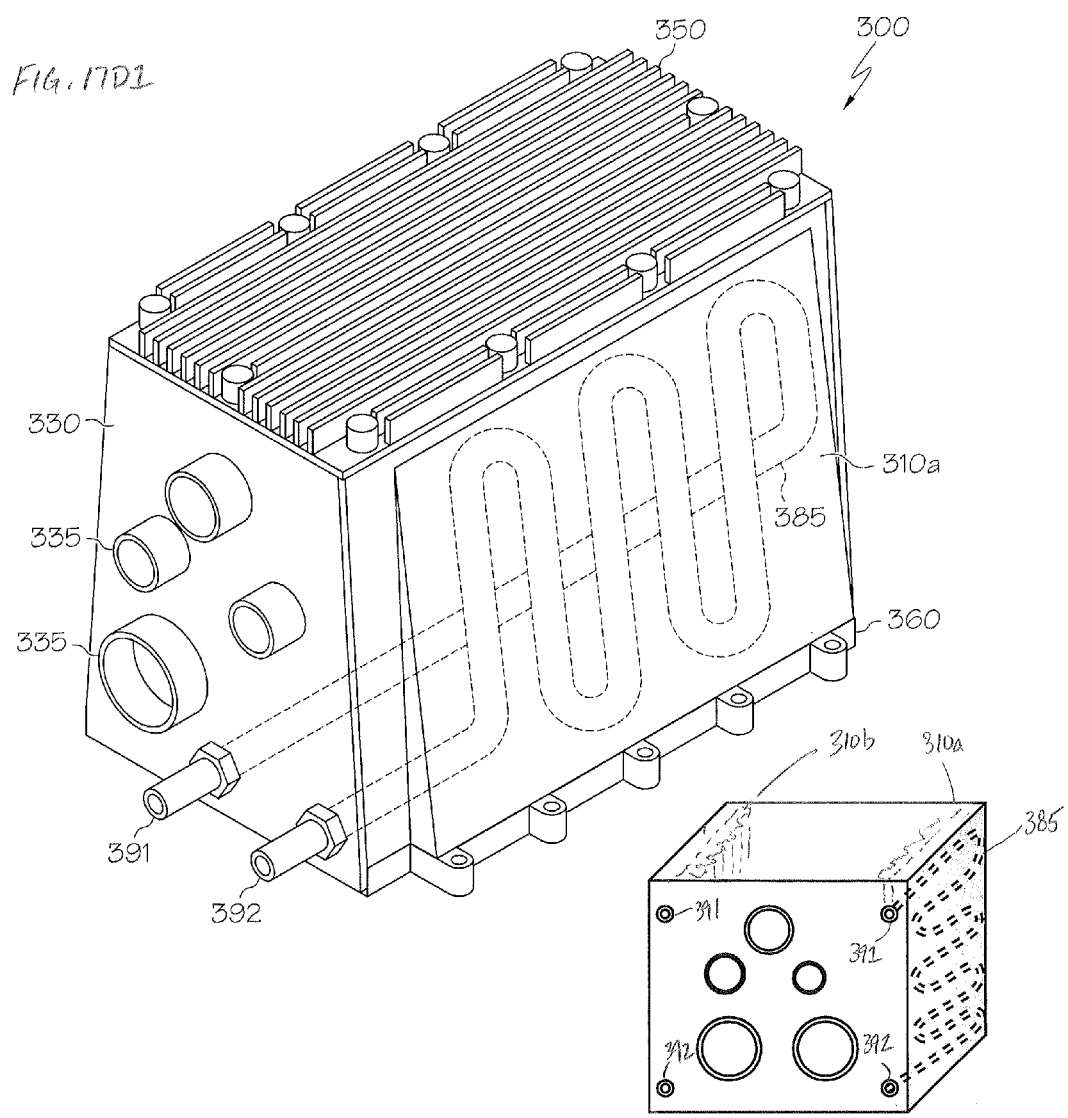
Fig 17D2

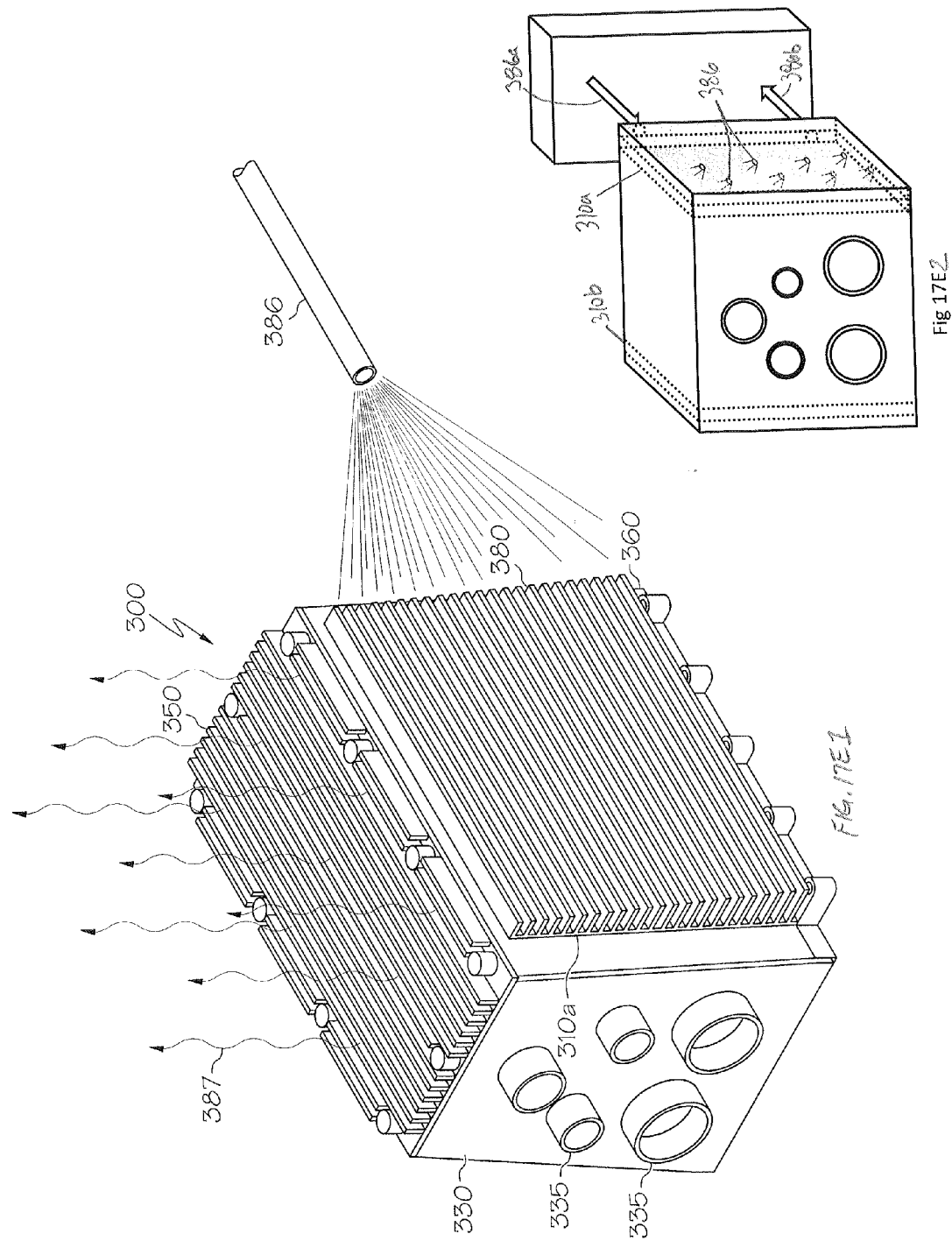

CONDUCTION-COOLED APPARATUS AND METHODS OF FORMING SAID APPARATUS

RELATED APPLICATIONS

This application claims the benefit of U.S. Provisional Patent Application Ser. No. 61/420,097, filed Dec. 6, 2010, and U.S. Provisional Patent Application Ser. No. 61/317,465, filed Mar. 25, 2010, the entire content of each being hereby incorporated herein by reference, in its entirety.

BACKGROUND

Circuit cards, for example, conduction-cooled circuit card assemblies (CCAs) complying with international standards such as IEEE Std. 1101.2-1992, ANSI-VITA 30.1, and ANSI/VITA 48.2, are generally mounted in a card cage or other type of enclosure.

During operation, electronic components on the circuit cards can generate a significant amount of thermal energy that causes the temperature on the circuit cards to increase. This can lead to overheating of critical components on the circuit cards and possible damage to the circuit cards.

Several conventional approaches are available to reduce the temperature inside a card cage. A common approach is to cool a circuit card by conductive cooling, i.e., dissipation or removal of heat from the circuit card to the surrounding card cage via a heat sink, conduction plate, and/or conduction frame attached to the circuit card, which conduct heat from the electronic components on the circuit card to the card cage chassis. This can be achieved by using wedge locks to secure the circuit card to a pair of parallel card guides that extend along an interior sidewall of the card cage to thereby form a thermal joint.

During operation, heat can be transferred away from the circuit card by conduction paths between the circuit card and the card cage chassis. The heat conducting elements in the conduction paths, in particular, the conduction frame and conduction plate of the circuit card, as well as the sidewalls and base of the card cage, are commonly formed of conducting materials such as aluminum, which offer thermal conductivity. However, power consumption levels of components inside the card cage, e.g., circuit cards, backplane, etc., have increased to a point where the thermal requirements of the card cage cannot be satisfied by conventional conduction cooling techniques. In particular, in high-power, conduction-cooled applications, where each circuit card generates a substantial amount of heat, and where card cages are densely packed with heat-generating circuit cards, heat cannot be sufficiently removed from the card cage.

SUMMARY

In addressing and overcoming the limitations associated with conventional conduction enclosure systems described herein, embodiments of the present inventive concepts provide systems and methods that offer efficient thermal energy removal from an enclosure interior to an external environment. To achieve this, the systems and methods include enclosure system elements that comprise an inner core and an outer conductive layer, membrane, shell, cladding, laminate, or skin positioned on at least a portion of the inner core. In particular, a composite structure comprising the inner core and outer structural layer can be used to form integrated cardguide conduction rails, a base, or other components of an enclosure system. These components offer high thermal conductivity and low thermal resistance. Accordingly, a plurality of heat-generating circuit cards can operate in the enclosure without overheating, since thermal energy generated by the circuit cards can be efficiently dissipated from the enclosure, thereby maintaining a suitable operating temperature in the enclosure.

Accordingly, embodiments of the present inventive concepts relate to devices and methods for the thermal management and control of conduction-cooled enclosure systems and circuit cards positioned in said enclosure systems.

In one aspect, a circuit card enclosure comprises: a backplane including a plurality of connectors; first and second conduction rails thermally coupled to a heat exchanger, the first and second conduction rails each comprising an inner body at least partially encapsulated by an outer body, the inner body comprising a thermally conductive material, the outer body comprising a structural material; and card slots of the circuit card enclosure defined between opposed card channels of the first and second conduction rails, each card slot constructed and arranged to register an inserted circuit card with at least one of the connectors, the card channels including a thermally conductive region constructed and arranged to thermally interface with a thermal frame of an inserted circuit card, the thermally conductive region of the card channels being thermally coupled to the inner body of the conduction rail.

The backplane can be thermally coupled to a backplane panel, and wherein the first and second conduction rails are thermally coupled to the heat exchanger via the backplane panel.

The inner bodies of the first and second conduction rails can extend into the backplane panel to abut an inner surface of the backplane panel.

A thermal conduction path can be provided between the thermally conductive regions of the card channels and the backplane panel via the inner bodies of the first and second conduction rails.

The backplane panel can include first and second inner body inserts that abut first and second inner surface regions of the backplane panel, the first and second backplane panel inner body inserts each comprising a thermally conductive material, and wherein lower surfaces of the inner bodies of the first and second conduction rails are thermally coupled to surfaces of the first and second inner body inserts of the backplane panel.

A thermal conduction path can be provided between the thermally conductive regions of the card channels and the first and second inner surface regions of the backplane panel via the inner bodies of the first and second conduction rails and the backplane panel inner body inserts of the backplane panel.

The circuit card enclosure can further comprise a cooling plate coupled to the backplane panel.

The cooling plate can be conduction-cooled.

The cooling plate can be air-cooled.

The outer body of the first and second conduction rails can comprise a thermally conductive material.

The thermally conductive material of the inner body of the first and second conduction rails can be lighter in weight per unit volume than the thermally conductive material of the outer body of the first and second conduction rails.

The thermally conductive material of the inner body can be optimized for thermal conductivity and wherein the structural material of the outer body can be optimized for structural integrity.

The thermally conductive material of the inner bodies of the conduction rails can comprise at least one material selected from: graphite, aluminum graphite, carbon fiber, metal matrix composites, advanced ceramics, carbon composites, carbon nanotubes, thermally conductive derivatives, and alloys thereof.

The structural material of the outer bodies of the conduction rails can comprise at least one material selected from: aluminum, copper, alloys thereof, and metal matrix composites.

The conduction rails can include internal reinforcements that are attached to inner surfaces of the outer body to reinforce the outer body.

The structural material of the outer bodies of the conduction rails can comprise a thermally conductive material.

The thermally conductive regions of the card channels can be constructed and arranged to thermally interface with a thermal frame of a conduction-cooled circuit card assembly (CCA).

The card channels can be defined between opposed surfaces of neighboring card guide rails that protrude from the first and second conduction rails, at least one of the opposed surfaces including the thermally conductive region of the card channel, portions of the inner bodies of the first and second conduction rails protruding into an inner body portion of the card guide rails.

Outer portions of the card guide rails can be integral with the outer bodies of the respective conduction rails.

A thermal interface material (TIM) can be positioned at the thermally conductive region of the card channel.

The circuit card enclosure can comprise a controlled-volume cavity in the thermally conductive region of the card channel and wherein the TIM is positioned in the controlled-volume cavity.

Portions of the thermally conductive material of the inner body can comprise a material having transverse isotropic thermal properties.

The material having transverse isotropic thermal properties can be thermally conductive in a planar direction of grains of the material and has reduced thermal conductivity in a vertical direction that is normal to the planar direction.

Grains of a first portion of the inner body can be oriented in a first planar direction, and wherein grains of a second portion of the inner body are oriented in a second planar direction, wherein the second planar direction is different than the first planar direction.

The inner body can comprise a composite material including a carbon-based matrix and a metal.

The carbon-based matrix can comprise graphite and wherein the metal comprises aluminum.

The inner body can have a thermal conduction property that is different from a thermal conduction property of the outer body.

The inner body can have a mechanical strength property that is different from a strength property of the outer body.

The outer body can comprise a composite material including a carbon-based matrix and a metal.

The carbon-based matrix can comprise graphite and wherein the metal comprises aluminum.

The heat exchanger can comprise cooling fins and wherein heat generated on the circuit cards is removed by natural convection air currents.

The heat exchanger can comprise cooling fins and wherein heat generated on the circuit cards is removed by the forced air flow.

The heat exchanger can comprise cooling fins, pipes, or channels, and further comprising a liquid distribution system thermally coupled to the heat exchanger, wherein heat generated on the circuit cards is removed via a liquid flow through the liquid distribution system.

The heat exchanger can comprise a liquid distribution system thermally coupled to inner body, wherein heat generated on the circuit cards is removed via a liquid flow through the liquid distribution system.

The heat exchanger can comprise cooling fins and further comprising a spray evaporative system that releases a spray on the cooling fins, wherein heat generated on the circuit cards is removed via spray evaporative cooling.

The heat exchanger can comprise cooling fins that are positioned at a surface of the enclosure other than a surface of the conduction rails.

The heat exchanger can comprise an active cooling element directly mounted to or coupled to the conduction rails.

The heat exchanger can comprise one or more cold plates.

In another aspect, a method of forming a circuit card enclosure comprises: providing a backplane including a plurality of connectors; providing first and second conduction rails thermally coupled to a heat exchanger, forming the first and second conduction rails to each comprise an inner body at least partially encapsulated by an outer body, the inner body comprising a thermally conductive material, the outer body comprising a structural material; and wherein card slots of the circuit card enclosure are defined between opposed card channels of the first and second conduction rails, each card slot constructed and arranged to register an inserted circuit card with at least one of the connectors, the card channels including a thermally conductive region constructed and arranged to thermally interface with a thermal frame of an inserted circuit card, the thermally conductive region of the card channels being thermally coupled to the inner body of the conduction rail.

The outer body of the first and second conduction rails can comprise a thermally conductive material.

The thermally conductive material of the inner body of the first and second conduction rails can be lighter in weight per unit volume than the thermally conductive material of the outer body of the first and second conduction rails.

The thermally conductive material of the inner body can be optimized for thermal conductivity and wherein the structural material of the outer body can be optimized for structural integrity.

The thermally conductive material of the inner body can comprise a material having transverse isotropic thermal properties.

The material having transverse isotropic thermal properties can be thermally conductive in a planar direction of grains of the material and has reduced thermal conductivity in a vertical direction that is normal to the planar direction.

Grains of a first portion of the inner body can be oriented in a first planar direction, and wherein grains of a second portion of the inner body are oriented in a second planar direction, wherein the second planar direction is different than the first planar direction.

The inner body can comprise a composite material including a carbon-based matrix and a metal.

The carbon-based matrix can comprise graphite and the metal can comprise aluminum.

The inner body can have a thermal conduction property that is different from a thermal conduction property of the outer body.

The inner body can have a mechanical strength property that is different from a strength property of the outer body.

The outer body can comprise a composite material including a carbon-based matrix and a metal.

The carbon-based matrix can comprise graphite and the metal can comprise aluminum.

In another aspect, a circuit card thermal frame comprises: an outer body; at least one inner body at least partially encapsulated by the outer body, the at least one inner body comprising a composite material including a carbon-based matrix and a metal, wherein the outer body comprises a material having a greater structural strength than a material of the inner body, and wherein the material of the inner body has a greater thermal conductivity than the material of the outer body; and first and second conduction flanges at first and second opposed edges of the outer body, the first and second conduction flanges being thermally coupled to the at least one inner body.

The outer body can comprise a composite material including a carbon-based matrix and a metal.

The carbon-based matrix can comprise graphite and the metal can comprise aluminum.

The carbon-based matrix of the inner body can comprise graphite and the metal of the inner body can comprise aluminum.

The at least one inner body can comprise a material having transverse isotropic thermal properties.

The material of the at least one inner body having transverse isotropic thermal properties can be thermally conductive in a planar direction of grains of the material and has reduced thermal conductivity in a vertical direction that is normal to the planar direction.

Grains of a first portion of the at least one inner body can be oriented in a first planar direction, and wherein grains of a second portion of the at least one inner body are oriented in a second planar direction, wherein the second planar direction is different than the first planar direction.

The at least one inner body can comprise first and second inner bodies spaced apart from each other, each inner body being positioned proximal to the first and second edges.

The at least one inner body can comprise third and fourth inner bodies in direct contact with portions of the first and second inner bodies nearest the conduction flanges, wherein grains of the material of the third and fourth inner bodies are normal to grains of the first and second inner bodies to promote thermal flow in a direction through the first and second conduction flanges.

The at least one inner body can comprise an inner body in a central region of the outer body, between the first and second conduction flanges.

BRIEF DESCRIPTION OF THE DRAWINGS

The foregoing and other features and advantages of the present inventive concepts will be apparent from the more particular description of embodiments of the present inventive concepts, as illustrated in the accompanying drawings in which like reference characters refer to the same parts throughout the different views. The drawings are not necessarily to scale, emphasis instead being placed upon illustrating the principles of the present inventive concepts. In the drawings:

FIG. 4A is an exploded perspective view of an embodiment of a base of an enclosure system including an inner core illustrated separate from an outer structural layer, in accordance with aspects of the present inventive concepts;

FIG. 4B is an perspective view of the composite base of FIG. 4A including the inner core in position on the outer structural layer;

FIG. 5A is an exploded perspective view of an embodiment of an enclosure system, in accordance with aspects of the present inventive concepts;

FIG. 6A is a partially transparent perspective section view of an embodiment of an enclosure system, in accordance with aspects of the present inventive concepts;

FIG. 6B is an expanded perspective view of the enclosure system of FIG. 6A including the illustration of conduction flow paths in a direction from a circuit card to an integrated cardguide conduction rail of the enclosure system, in accordance with aspects of the present inventive concepts;

FIG. 13B is a perspective view of the circuit card thermal frame of FIG. 13A illustrating a base card and mezzanine cards mounted to the frame.

FIG. 15A is a perspective view of a circuit card thermal frame, in accordance with another embodiment of the present inventive concepts.

FIGS. 17A1, 17A2, 17B1, 17B2, 17C1, 17C2, 17D1, 17D2, 17E1, 17E2, 17F, 17G and 17H are perspective views of card cages illustrating a variety of heat exchange techniques, in accordance with embodiments of the present inventive concepts.

DETAILED DESCRIPTION OF EMBODIMENTS

Figure 1:
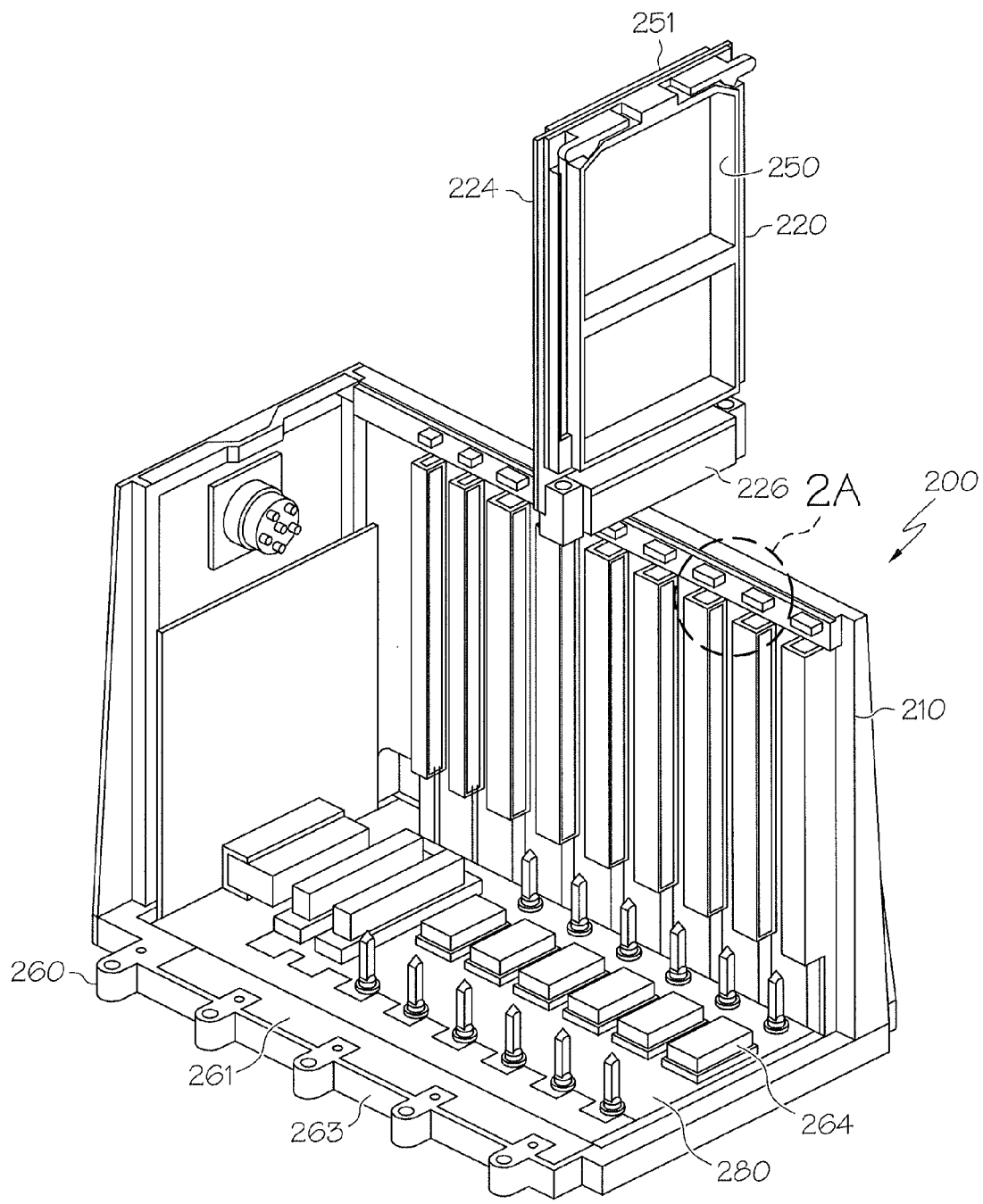
FIG. 1 is a cutaway perspective view of an embodiment of an enclosure system, in accordance with aspects of the present inventive concepts.

Various example embodiments will now be described more fully with reference to the accompanying drawings in which some example embodiments are shown. These inventive concepts may, however, be embodied in different forms and should not be construed as limited to the embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These tennis are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Further, the regions illustrated in the figures are schematic in nature and their shapes are not intended to illustrate the actual shape of a region of a device and are not intended to limit the scope of the present inventive concepts.

In order to overcome the limitations described above with regard to conventional approaches to thermal management of one or more circuit cards in an enclosure system, it is desirable that an enclosure system include favorable thermal characteristics so that the enclosure system more efficiently conducts and transfers heat produced by circuit cards positioned therein to an ambient environment.

To achieve this, a conduction-cooled apparatus according to the present inventive concepts can remove heat therein by providing a conduction-cooled enclosure having elements that are composed of a structure comprising an inner core comprising a material having enhanced thermal conductivity and a thin outer structural layer on the inner core. In preferred embodiments, the enclosure includes at least one of conduction rails and a base. One or more circuit cards can be positioned in the enclosure and placed in thermal contact with the outer structural layer, whereby a thermal conduction path is present between the circuit cards and the inner core to remove the heat from the heat-generating electronic components. In addition, the material having enhanced thermal conductivity of the inner core can comprise a material having grains that are oriented in one or more grain orientations to provide a desirable thermal conductivity path. The features of high thermal conductivity of the composite material and the structural benefits of the outer structural layer, as well as orientation of the material grains according to optimal grain directions of the composite material of the present embodiments permit heat to be more efficiently dissipated. This feature is particularly beneficial in applications where a plurality of circuit cards having high power requirements are closely stacked together in a card cage, wherein, unlike in conventional systems, a desirable operating temperature can be maintained in the card cage despite substantial heat generated in the enclosure system by the circuit cards.

FIG. 1 is a cutaway perspective view of an embodiment of an enclosure system 200, in accordance with aspects of the present inventive concepts.

In an embodiment, the enclosure system 200 can comprise a conduction-cooled enclosure system, for example, a card cage assembly. In other embodiments, the enclosure system 200 can include a computer system chassis, rack, or other enclosure that can receive one or more circuit cards 220. In an embodiment, the enclosure system 200 can comply with form factors known to those of ordinary skill in the art, for example, ATR form factors and the like, or can include commercial off-the-shelf (COTS), ruggedized, or custom form factors. In one embodiment, the enclosure system 200 can comprise a baseplate conduction-cooled style enclosure, and can include one or more conduction-cooled circuit cards 220, for example, CCAs. In another embodiment, the enclosure system 200 can comprise a forced-air conduction-cooled enclosure. In another embodiment, the enclosure system 200 can comprise a liquid-cooled style enclosure. In another embodiment, the enclosure system 200 can comprise a low pressure drop (HPLP) liquid-cooled card cage, such as that of the type described in U.S. Pat. No. 7,450,384, incorporated herein by reference in its entirety. For example, the HPLP approach could be implemented in connection with the conduction rails and/or the baseplate of the enclosure system 200. The enclosure system 200 can further comprise a plurality of card cages that are configured together and positioned inside a super-enclosure, for example, a rack of card cages.

As shown in FIG. 1, the enclosure system 200 comprises a first conduction rail 210, also referred to herein as a cardguide conduction rail, coupled to a base 260. A second conduction rail 210 (not shown in FIG. 1) is similarly coupled to the base 260, opposite the first conduction rail 210. At least one circuit card 220 can be inserted into the enclosure system 200. The circuit card 220 can comprise a substrate 224, for example, a printed circuit board (PCB), which is populated with a plurality of electronic circuits. The circuit card 220 can include a conduction frame 250 positioned about a periphery of the substrate 224 for removing heat from the electronic circuits on the card. The circuit card 220 can also include a conduction plate 251 coupled to a bottom surface of the substrate 224 that provides a thermal interface between the circuit card 220 and the conduction rail 210. The circuit card 220 can also include a connector 226 that, when coupled to a mating connector 264 on a backplane 280, also referred to as a motherboard, or other processor on the base 260, can provide an electrical connection between the circuit card 220 and the backplane 280, for example, to provide power to the circuit card 220 and/or transmit signals between the circuit card 220 and the backplane 280.

Figure 5B:
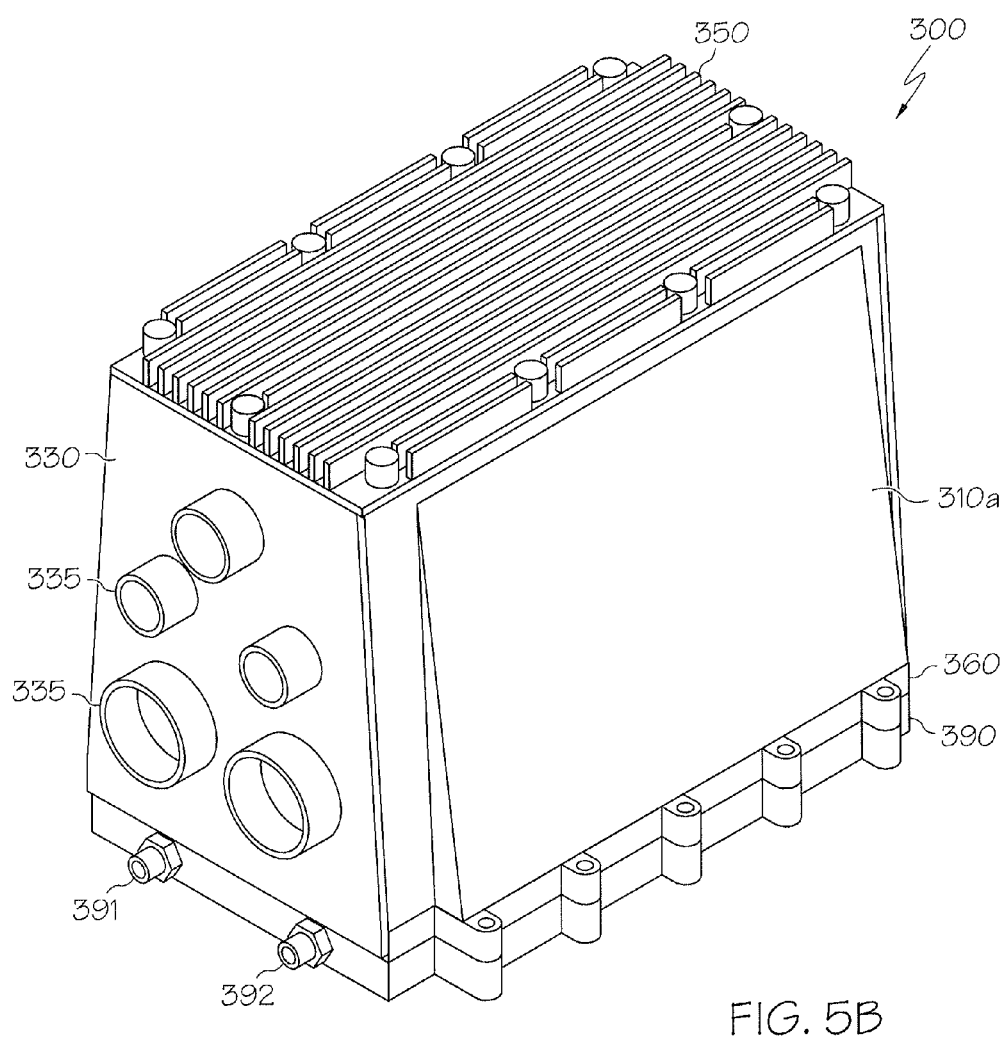
FIG. 5B is an assembled perspective view of the enclosure system of FIG. 5A.

One or more of the conduction rail 210, base 260, conduction frame 250 and conduction plate 251 of the circuit card 220 can comprise materials having enhanced thermally conductive properties. In this manner, during operation, when the electronic components on the circuit card 220 generate heat, such heat can be transferred from the circuit card 220 to the conduction rail 210 and base 260 of the enclosure system 200 by thermal conduction paths present between the circuit card 220 and the enclosure system. Further, electronic components located on the backplane 280 of the base 260 can generate heat, which is transferred away via a conduction frame 263 at the base 260. Heat transferred to the conduction rails 210 is, in turn, transferred to the base 260, and further to a portion of an external temperature-controlled cold plate 390 coupled to the base 260, as shown in FIGS. 5A and 5B. At least one of the conduction rail 210 and the base 260 comprises an inner core 211, 261 encapsulated by a outer structural layer 212 (see FIG. 2A), which collectively permit heat to be more efficiently dissipated from the circuit board 220 and/or backplane 280 to the conduction rail 210 and base 260, or to other heat-conducting elements of the enclosure system 200. Accordingly, the temperature of the enclosure system 200 can be maintained to within a temperature range sufficient for operation, even when the enclosure system is densely packed with circuit cards 220, including circuit cards 220 having high-power requirements.

Figure 2A:
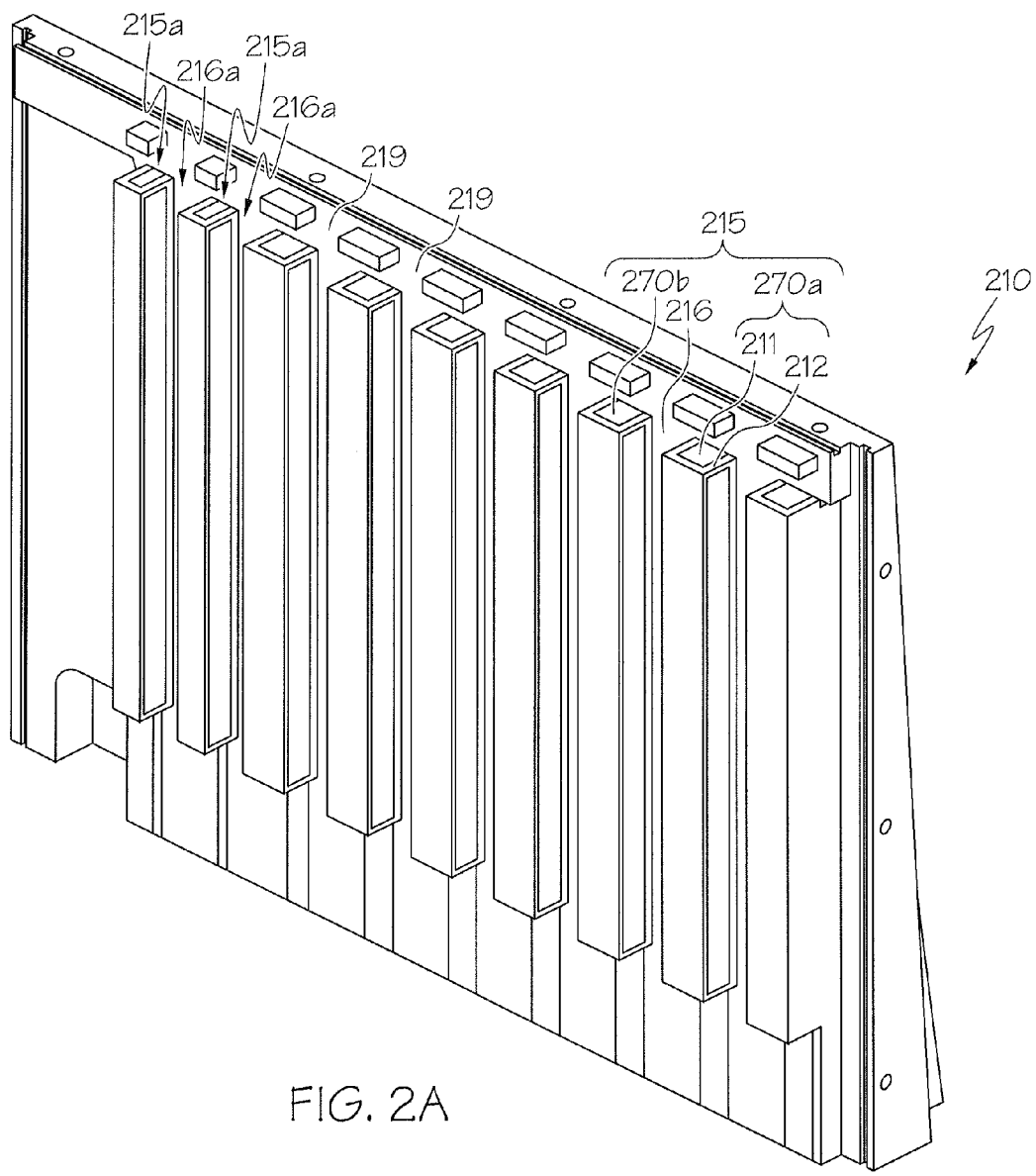
FIG. 2A is a close-up perspective view of an embodiment of a conduction rail of the enclosure system of FIG. 1, in accordance with aspects of the present inventive concepts.
Figure 2B:
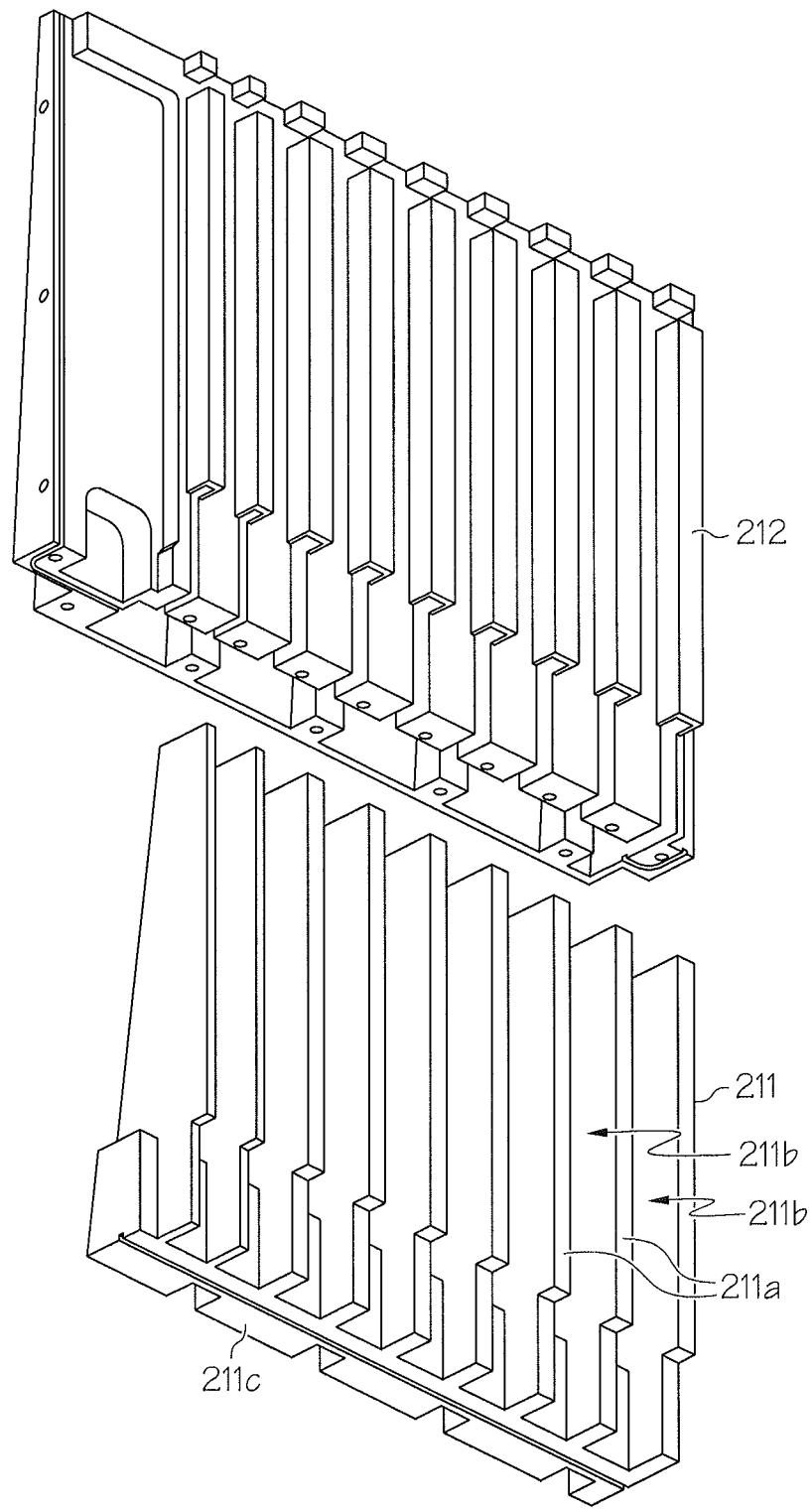
FIG. 2B is an exploded perspective view of the conduction rail of FIG. 2A illustrating an inner core separated from an outer structural layer.

FIG. 2A is a close-up perspective view of an embodiment of the conduction rail 210 of the enclosure system 200, in accordance with aspects of the present inventive concepts. FIG. 2B is an exploded perspective view of the conduction rail 210 of FIG. 2A illustrating an inner core 211 separated from an outer structural layer 212.

In some embodiments, the conduction rail 210 can comprise at least one of a right conduction rail 310a or a left conduction rail 310b of an enclosure chassis, for example, as shown in FIG. 5A. In other embodiments, the conduction rail 310 can comprise a front, back, top, or bottom panel of an enclosure chassis. The first and second conduction rails 310a, 310b can be positioned to oppose each other, on opposite sides of the enclosure system 300, for example, at left and conduction frames, in this case, side panels of an enclosure system, as shown in FIG. 5A, or at front and back walls of an enclosure system, or at a top and bottom walls of an enclosure system.

Returning to FIGS. 2A, the conduction rail 210 can include one or more card guides 215. Each card guide 215 can include at least two neighboring card guide rails 270a, 270b extending from the conduction rail 210 and defining a card guide channel 216 therebetween.

In embodiments that include first and second conduction rails, for example, illustrated in FIG. 5A, the first and second conduction rails 310a, 310b can include first and second card guides 315a, 315b, respectively, which are parallel with each other, aligned with each other, and spaced apart from each other at opposite sides of the enclosure system 200. Each card guide 315a, 315b is constructed and arranged to receive an edge of a circuit card, for example, an edge of circuit card 220 shown in FIG. 1. Returning to FIG. 2A, in one embodiment, the card guide 215 is formed as an integral portion of a wall of the conduction rail 210, such that the conduction rail 210 and card guide 215 are formed together during manufacturing. In another embodiment, the card guide 215 can be formed separate from the conduction rail 210 and then later thermally coupled or otherwise mounted to the wall of the conduction rail 210. Two card guides 215 can be positioned to be parallel with, and aligned with, each other, at opposite sides of the enclosure system 200. In this manner, a circuit card, when inserted into the insertion end at a front section of the enclosure system 200, can be secured in first and second card guides 215 at left and right sidewalls, respectively, of the conduction rail 210. However, in other embodiments, card guides 215 can be positioned at top and bottom surfaces, respectively, of the enclosure system 200.

The card guide rails 270a, 270b can have the same thickness, the thickness of the card guide rails 270a, 270b defining the spacing between neighboring card guide channels.

Some of the card guide rails 215a can have different thicknesses, in order to define spacings between neighboring card guide channels that are closer to each other, or more distant from each other. For example, in the event that certain types of circuit boards are known to have a thinner profile, or known to generate less heat, and therefore can be placed closer together, these types of circuit boards can be placed in slots 216a defined by the relatively narrow card guide rails 215a. At the same time, other types of circuit boards that are known to have a thicker profile, or known to generate relatively more heat, and should therefore be placed further apart from each other, can be placed in slots 216 defined by the relatively wider card guide rails 215. Variations on this theme are within the scope of the present inventive embodiments.

The card guides 215 are constructed and arranged to ensure proper alignment and registration of a circuit card 220 with a motherboard or backplane 280 at an end of the enclosure system 200 opposite an insertion end, so that proper electrical connection between the circuit card and the motherboard can be achieved. A connector 226 on the circuit card is guided into proper registration with a connector 264 on the motherboard. At the same time, the edges of the mounted circuit card 220 interface with the card guide channel 216 defined between neighboring card guide rails 270a, 270b. The edges of the circuit card 220 are mounted therein so as to form a thermal joint between the circuit card 220 and each of the first and second conduction rails 210. The edges of the circuit card can be further secured to the card guide channel 216 of the card guide 215 by one or more wedge clamps, for example in the manner described and illustrated below in connection with FIG. 7D.

In one embodiment, the card guide channel 216 between the two card guide rails 270a, 270b can include a card substrate slot (not shown), also referred to as a substrate groove, which extends in a same direction of extension as the rails 270a, 270b. The substrate slot can comprise a groove that is positioned in the substrate slot on the flat portion of the surface of the conduction rail 210 between the two sidewalls of the neighboring card guide rails 270a, 270b. The groove is dimensioned to accommodate an edge of a substrate 224 of an inserted circuit card 220.

Referring to FIGS. 2A and 2B, the conduction rail 210 includes an inner core 211 of material, or inner body, having enhanced thermal conductivity and an outer structural layer 212, or outer body, that at least partially surrounds the inner core 211. In an embodiment, the outer structural layer 212 partially encapsulates, or completely encapsulates, the inner core 211. At least a portion of the inner core 211 is positioned in the card guide rails 270a, 270b along their lengths. Portions of the inner core 211 can also be present in the body of the wall 219 of the conduction rail 210 so that the inner core 211 comprises a unitary core that includes card guide rail portions 211a and sidewall portions 211b. The outer structural layer 212 can likewise comprise a unitary layer that encapsulates the card guide rail portions 211a and sidewall portions 211b of the inner core 211.

In one embodiment, the inner core 211 can be formed of a material including at least one of graphite, carbon fiber, metal matrix, advanced ceramics, carbon composites, metal matrix composites, carbon nanotubes, aluminum, and thermally conductive derivatives, alloys, or a combination thereof. In one embodiment, the inner core 211 comprises aluminum graphite. In one embodiment, the inner core 211 comprises AlGR$_p$® 4-750, available from Metal Matrix Cast Composites, LLC, Waltham, Mass. 02453, USA.

An embodiment of the outer structural layer 212 can comprise one or more thermally and/or electrically conductive materials and/or alloys, such as copper, aluminum, gold, etc. In an embodiment, the outer structural layer 212 includes Metgraf® 4-230, available from Metal Matrix Cast Composites, LLC, Waltham, Mass. 02453, USA. In another embodiment, the outer structural layer 212 can comprise aluminum metal graphite. In another embodiment, the outer structural layer can comprise a multiple-layered configuration including a layer of nickel with plating. The outer structural layer can also comprise a composite material, for example a composite including a carbon-based matrix and a metal. In one example, the carbon-based matrix comprises graphite, and the metal comprises aluminum.

The inner core 211 can comprise a composite material, for example a composite including a carbon-based matrix and a metal. In one example, the carbon-based matrix of the inner core comprises graphite, and the metal of the inner core comprises aluminum. The grains of the inner core can be arranged in planes in the horizontal direction, and the planes can be arranged in multiple layers in the vertical direction. The characteristics of the composite material of the inner core can be optimized so that the inner core has thermal conductive properties that are substantially transverse isotropic. In this sense, the material of the inner core is thermally conductive in the planar direction of the grain layers, while having greatly reduced thermal conductivity in the vertical direction of the grain layers.

The outer structural layer can also comprise a composite material, for example a composite including a carbon-based matrix and a metal. In one example, the carbon-based matrix of the outer structural layer comprises graphite, and the metal of the outer structural layer comprises aluminum. The composite material of the inner core and the composite material of the outer core can be designed to have different properties. For example, the outer structural layer can be designed to be a stronger structural material than the inner core. At the same time, the material of the outer structural layer can have a lower thermal conductivity in the planar direction than the material of the inner core, while exhibiting greater thermal conductivity in the vertical direction than the material of the inner core.

In one embodiment, the outer structural layer 212 can have a thickness of approximately 0.08 inches. Suitable thicknesses, dimensions, material types, and the like of the outer structural layer 212 are dependent on a number of factors including size, integrity considerations, environmental considerations, weight, and the like.

In an embodiment, the outer structural layer 212 is formed about the inner core 211 by casting the material used to form the outer structural layer 212. In this manner, a composite structure is formed from the cast outer structural layer 212 and inner core 211. In another embodiment, the material used to form the outer structural layer 212 is molded about the inner core 211. In an embodiment, the outer structural layer 212 is coupled, bonded, clad, or laminated to the inner core 211. In one example, as illustrated in FIG. 2B, the inner core 211 and outer structural layer 212 are each pre-formed, and the inner core 211 is inserted into the outer structural layer 212. In another example embodiment, the inner core 211 is pre-formed, and the outer structural layer 212 is cast about the inner core 211, wherein the resulting composite structure is machined to form the conduction rail 210. In another embodiment, the outer structural layer 212 can be plated with a thermally conductive material, to ensure that a thermally conductive interface can be formed between an inserted circuit card and the conduction rail via the plating.

Figure 16A:
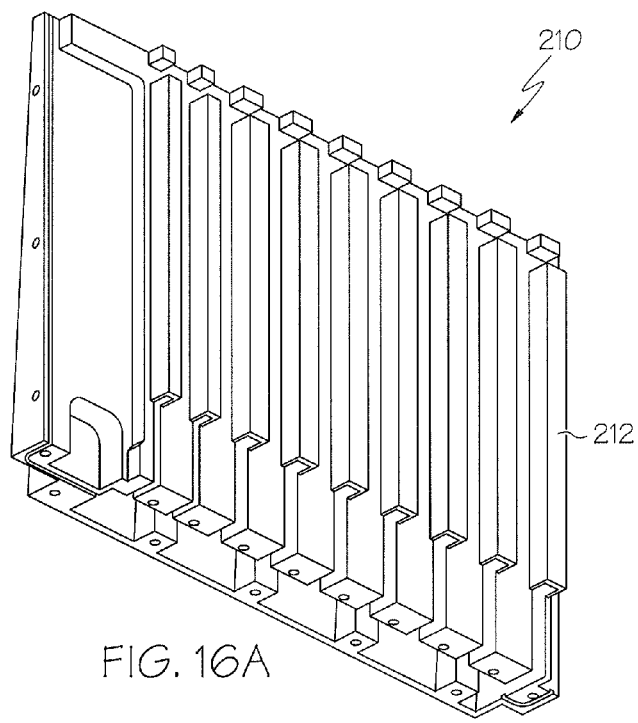
FIGS. 16A, 16B, and 16C illustrate reinforcements added to the conduction rail to reinforce the conduction rail, in accordance with another embodiment of the present inventive concepts.
Figure 16B:
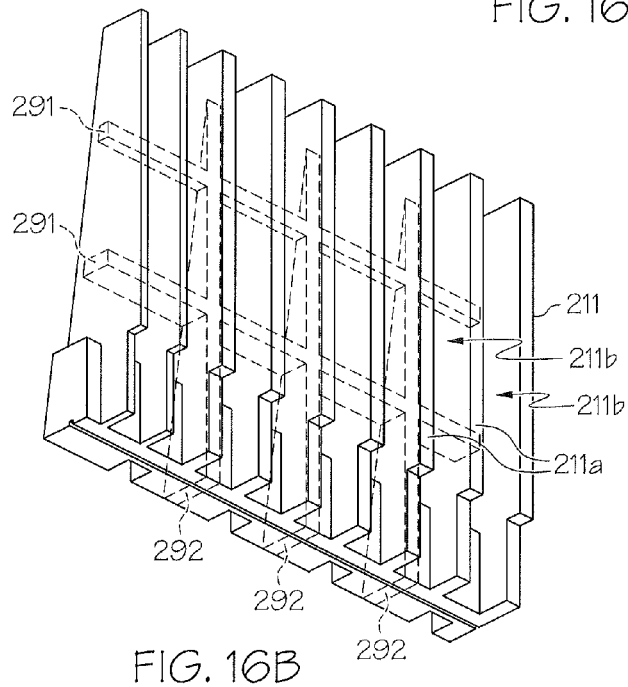
Figure 16C:
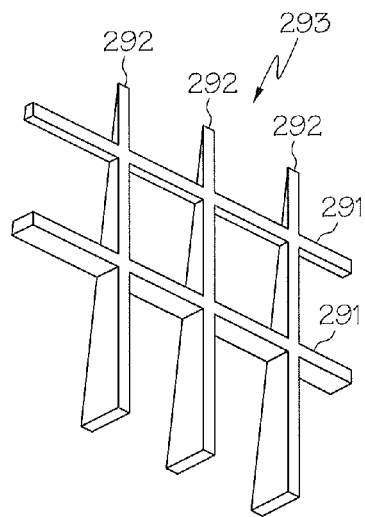

Referring to FIGS. 16A, 16B and 16C, in another embodiment, the outer structural layer 212 can comprise an outer shell that at least partially encapsulates the inner core 211.

Reinforcements 293 in the form of members or features can be further included. In various examples, the reinforcements 293 can take the form of pillars, beams, separators, or other geometric shapes and patterns that span between the outer layers of the shell material to provide additional structural rigidity. In the present example embodiment, the reinforcements include cross-bracing reinforcements 291 that span across the conduction rail 210 in a horizontal direction as well as vertical reinforcements 292 that span along the conduction rail 210 in a vertical direction. The reinforcements 293 can be cast into the shell of the outer structural layer 212, or otherwise be joined with the outer structural layer 212, prior to insertion of the inner core 211. Alternatively, the reinforcements 293 can be embedded into the inner core 211 during its formation and then the reinforced inner core 211 can be joined to the outer structural layer 212. An embodiment of the latter approach is illustrated in FIGS. 16A-16C. Reinforcement of the resulting conduction rail 210 may be used to reduce the thickness of the outer structural layer 212, to increase thermal performance, reduce weight, and/or to increase the rigidity of the structure for high levels of shock and vibration tolerance.

The resulting composite structure provides a thermally enhanced material that provides suitable structural characteristics as well as high-thermal conductivity properties.

As described herein, the composite structure comprising the inner core 211 and outer structural layer 212 can be fabricated to form a conduction rail 210, base 260, front or rear panel 330, 340 (see FIG. 5A), top panel 350 (see FIG. 5A below) or other component of the enclosure system 200. In forming such components, manufacturing is simplified, and inexpensive as compared to other fabrication processes, which can be labor-intensive, complex, and expensive. In addition, certain materials that can be used to form the inner core 211 are relatively lighter in weight as compared to conventional thermally conductive materials. Accordingly, when a thin outer structural layer 212 is positioned about the inner core 211, the conduction rail 210 formed from the composite material is relatively lighter in weight as compared to aluminum-based materials or other conductive materials used in conventional conduction-cooling conduction rails, while, at the same time, offering improved thermal flow performance.

Figure 3A:
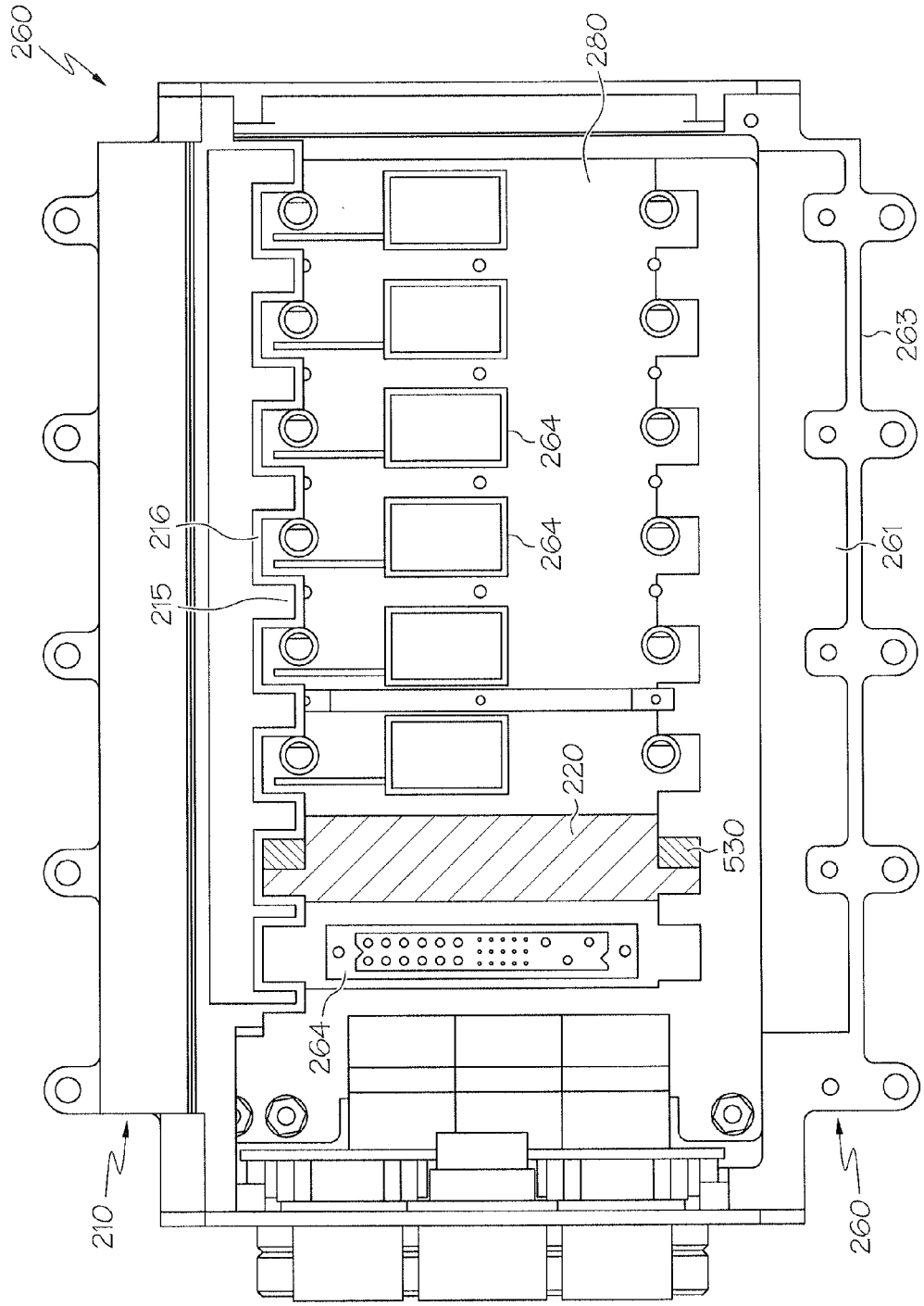
FIG. 3A is a top view of an embodiment of the base of the enclosure system of FIG. 1, in accordance with aspects of the present inventive concepts.
Figure 3B:
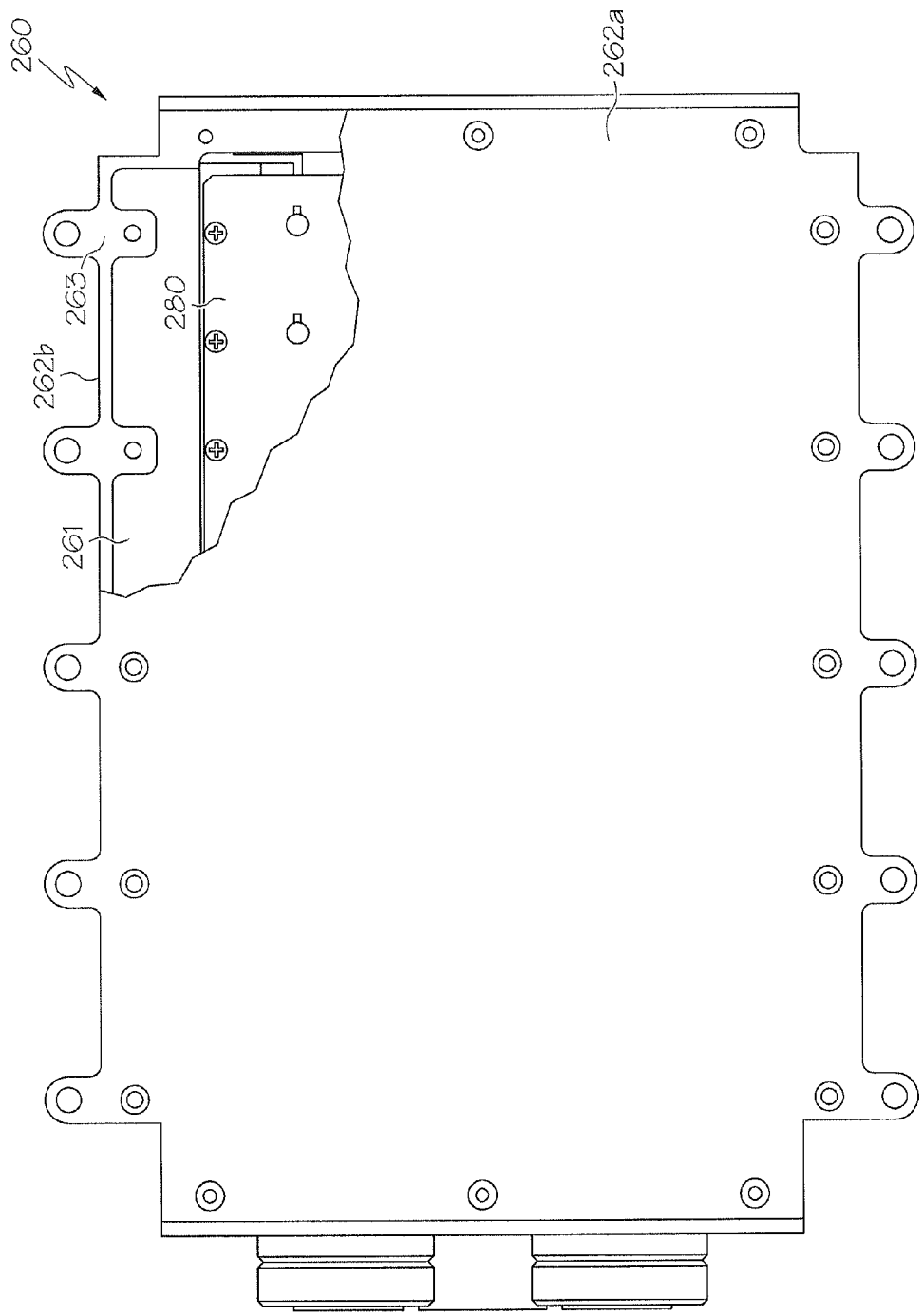
FIG. 3B is a partial cutaway bottom view of the base of FIG. 3A.

FIG. 3A is a top, partially assembled view of an embodiment of the base 260 of the enclosure system 200 of FIG. 1, in accordance with aspects of the present inventive concepts. FIG. 3B is a cutaway bottom view of the base 260 of FIG. 3A. FIG. 4A is an exploded perspective view of an unassembled base 260 including an inner core 261 separated from a outer structural layer 262, in accordance with aspects of the present inventive concepts. FIG. 4B is a perspective view of the base 260 of FIG. 4A including the inner core 261 positioned on the outer structural layer 262.

As discussed above, the enclosure system 200 includes an enclosure backplane 280. The backplane 280 can be configured as a switched-fabric backplane or other suitable backplane, such as a VPX backplane, VME64x backplane, rugged μTCA backplane, VXS backplane, CompactPCI backplane, or other standard or custom backplane. In other embodiments, the enclosure system 200 comprises a motherboard, backplane, system board, or other processor positioned at a rear or bottom section of the enclosure system 200, depending on the configuration of the enclosure system 200. In the embodiment depicted in FIGS. 1 and 3A-4B, the base 260 including the backplane 280 is positioned at a bottom portion of the enclosure system 200. In other embodiments, the base 260 can be positioned at a back or rear section, or at a side section, of the enclosure system 200.

FIG. 3A illustrates a partially assembled top view in which a first conduction rail 210 is shown mounted to the base 260 at a first top edge of the base and in which no conduction rail is mounted to a second bottom edge of the base opposite the first top edge. A top view of the first conduction rail 210 can be seen in this view, including a top view of the card guides 215 and card guide channels 216. A single circuit card 220 is also shown inserted in the second card slot from the left side. A plurality of circuit cards 220 can be inserted and removed from a first end of the enclosure system 200 opposite the end where the base 260 including the backplane 280 is positioned. The enclosure backplane 280 can include a plurality of connectors 264, each of which can receive a mating connector of a circuit card 220. The backplane 280 provides a communication network that enables an inserted circuit card 220 to communicate with other components of the backplane 280 or enclosure system, or to communicate with other circuit cards 220 also coupled to the backplane 280. As described herein, first and second opposed conduction rails 210 are mounted to the base 260. The opposed conduction rails 210 protect the backplane 280 and define parallel card guide channels 216 of the enclosure system 200.

In one embodiment, the base 260 comprises a conduction frame 263 to which the backplane 280 is mounted in such a manner that the backplane lies laterally within the outer perimeter of the conduction frame 263. The base 260 can have a construction that is similar to the construction of the first and second conduction rails 210. In particular, the base 260 can include one or more inner core inserts 261 comprising material having enhanced thermal conductivity, for example, a material similar to the material of the inner core 211 of the conduction rails 210. The inner core inserts 261 can be positioned, at either side of, or about an inner region of, the conduction frame 263 of the base 260. In particular, the inner core inserts 261 can be positioned in the base 260 at a location that is directly below the lower surface 211c of the inner core 211 of the conduction rails 210. In this manner, the conduction rails 210 can be mechanically mounted to the base so that the inner cores 211 of the conduction rails 210 and the inner core inserts 261 of the base 260 are in direct contact with each other, thereby providing an enhanced thermal conductive pathway from the conduction rails 210 to the base 260 via their inner cores 211, 261 with a thermal interface material (TIM) or thermal grease between these two components.

The conduction frame 263 of the base 260 includes a lower panel 262a at a bottom surface thereof and sidewalls 262b at a perimeter thereof. Together, lower panel 262a and sidewalls 262b provide a structural layer of the conduction frame 263 that supports the inner core inserts and that mechanically and electrically shields the backplane 280. In one embodiment, the lower panel 262a and sidewalls 262b of the base 260 can be fabricated as separate elements that are mounted together. In another embodiment, the lower panel 262a and sidewalls 262b can be fabricated as a single, unitary element.

In one embodiment, the inner core 261 and conduction frame 263 of the base collectively form a composite structure similar to that of the conduction rails 210 described herein. The base conduction frame 263, in one embodiment, can have a thickness that is similar to the thickness of the outer structural layer 212 of the conduction rails 210. In other embodiments, the base conduction frame 263 can have another suitable thickness. Further, the base conduction frame 263 can comprise a material similar to or the same as those used for the outer structural layer 212 of the conduction rail 210, for example, includes Metgraf® 4-230. Similarly, the inner core inserts 261 of the base can comprise a material having enhanced thermal conductivity similar to those or the same as those used for the inner core 211 of the conduction rails 210.

Methods of formation of the base conduction frame 263 can be similar to those of the conduction rails 210, as discussed above, or can be different, depending on the application. For example, the structural layer of the conduction frame 263 of the base 260 can be formed about the inner core inserts 261 by casting the material used to form the structural layer 263. In other embodiments, the structural layer can be foamed separately from the inner core inserts 261 and is bonded or laminated to the inner core inserts 261, or otherwise positioned on the inner core inserts 261. In another embodiment, the base 260 is formed by machining the composite structure comprising the conduction frame layer 263 and inner core inserts 261. The resulting base 260 is relatively lighter in weight as compared to solid-aluminum-based materials or other conductive materials, while, at the same time, offering improved thermal flow performance.

When the resulting base 260 is coupled to conduction rails of the enclosure system, for example, conduction rails 210 shown in FIGS. 1-2, the inner core inserts 261 of the base 260 and the inner core 211 of the conduction rails 201 are encompassed by the base conduction frame 263, including the lower panel 262a and sidewalls 262b, and the outer structural layer 212 of the conduction rails 210, which provide structural support and protection for the enclosure. In one embodiment, the inner core inserts 261 can be positioned or configured to directly abut a bottom portion of the inner core 211 of the conduction rail 210. An example of the resulting configuration can be seen in the cutaway side view of FIG. 6C. In this manner, a thermal conduction path can extend from the inner core 211, 411 of the conduction rail 210, 410 to the inner core inserts 261, 461 of the base 260. The thermal conduction path will be described in further detail herein.

FIG. 5A is an exploded perspective view of an embodiment of an enclosure system 300, in accordance with aspects of the present inventive concepts. FIG. 5B is an assembled perspective view of the enclosure system 300 of FIG. 5A.

The enclosure system 300, in one embodiment, comprises a first conduction rail 310a, a second conduction rail 310b, and a base 360. In an embodiment, the first conduction rail 310a, second conduction rail 310b, and base 360 can be the same as, or similar to, conduction rails and bases described in other embodiments herein. The enclosure system 300 can further comprise a front enclosure I/O panel 330, a rear enclosure panel 340, and an enclosure access panel 350.

The front I/O panel 330 can include a plurality of I/O connectors 335, for example, serial connectors, video connectors, Ethernet connectors, and the like, or other connectors known to those of ordinary skill in the art, for example, application-specific connectors. In one embodiment, the I/O connectors 335 on the front I/O panel 330 are electrically connected to the enclosure backplane 380 on the base 360.

The enclosure access panel 350 can be removably coupled to the front enclosure I/O panel 330, rear enclosure panel 340, and/or conduction rails 310a, 310b by a plurality of fastening devices, such as screws. In this manner, the enclosure access panel 350 can be removed so that circuit cards (not shown) can be added to, removed from, or accessed in the enclosure system 300. In one embodiment, the enclosure access panel 350 can further assist in the distribution of heat away from electronic components in the enclosure, for example, circuit cards. In the embodiment shown, the enclosure access panel includes a heat sink on its upper surface for this purpose. The conduction rails 310a, 310b, base 360, and/or enclosure access panel 350 can comprise an inner core and outer structural layer, constructed in a manner similar to those described herein.

In one embodiment, the enclosure system 300, at a lower surface of the base 360, is coupled to a cold plate 390 for removal of heat from the enclosure 300, for distribution to an external location. The cold plate is placed in direct thermal contact with an underside of the base 360. The cold plate 390 can include an enclosed fluid path for supporting coolant flow into and from the cold plate 390. Pumped coolant is provided at a supply coupling 391 and removed at a return coupling 392. Heat that is distributed from the electronic components on the circuit cards to the base 360 is drawn into the cold plate and removed via the output coolant.

Figure 6C:
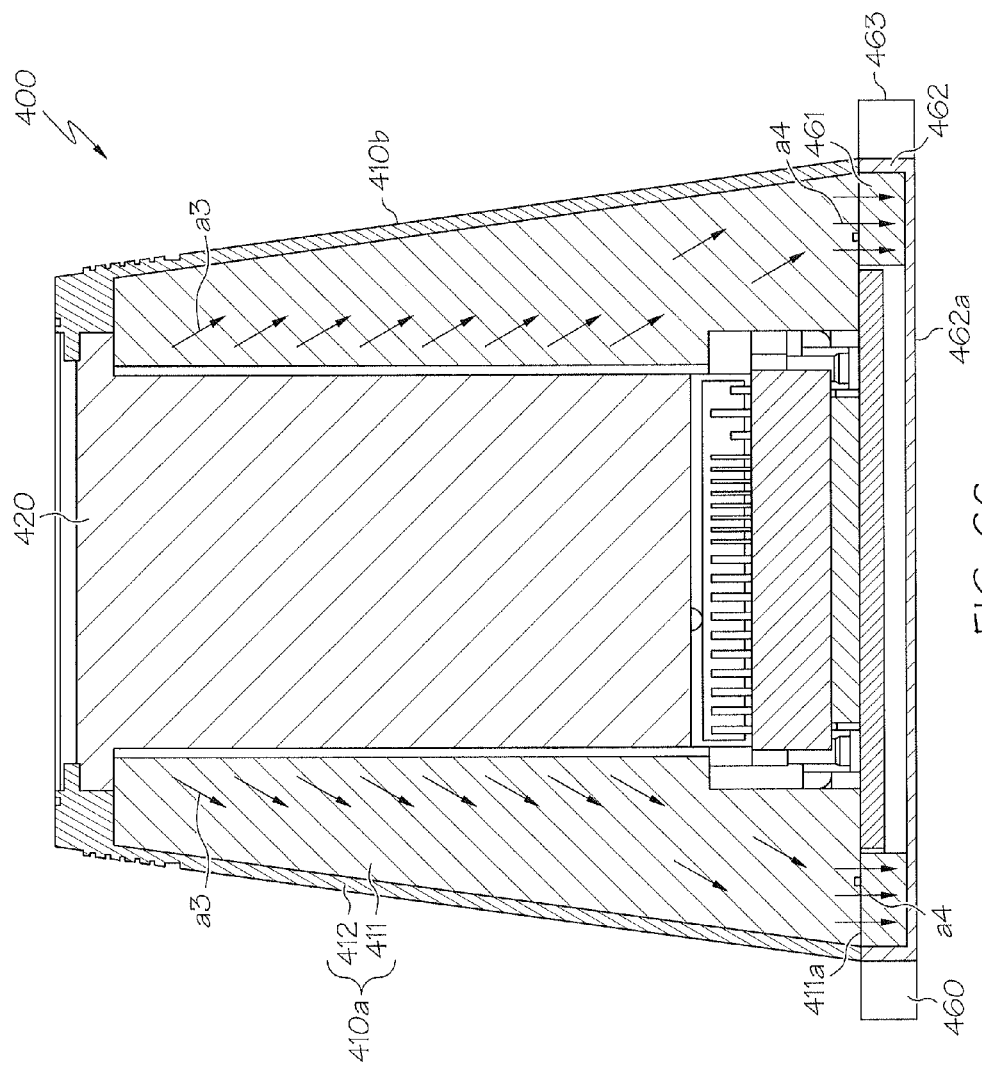
FIG. 6C is a cross-sectional front view of the enclosure system of FIGS. 6A and 6B illustrating conduction flow paths in a direction from the circuit card to the conduction rail and base of the enclosure system, in accordance with aspects of the present inventive concepts.

FIG. 6A is a partially transparent perspective view of an embodiment of an enclosure system 400, in accordance with aspects of the present inventive concepts. FIG. 6B is an expanded perspective view of the enclosure system 400 of FIG. 6A including the illustration of heat conduction flow paths (a) in a direction from a circuit card 420 to a conduction rail 410 of the enclosure system 400, in accordance with aspects of the present inventive concepts. FIG. 6C is a cross-sectional front view of the enclosure system of FIGS. 6A and 6B illustrating conduction flow paths (a) in a direction from a circuit card 420 to conduction rails 410a and 410b and base 460 of the enclosure system 400, in accordance with aspects of the present inventive concepts.

The enclosure system 400 of FIG. 6A includes a circuit card 420 securely positioned in one of the card slots for illustrating heat conduction flow paths (a) between the circuit card 420 and the enclosure system 400. In one illustrative conduction flow path, heat is generated at electronic components of a circuit card. In particular, the heat-generating components are placed in thermal contact with a thermal conduction frame of the circuit card 420. The circuit card 420 is mounted in the card slot so that edges of its thermal conduction frame form a thermal joint with the inner sidewalls of the thermally conductive card guide rails 270a, 270b (see FIG. 2A) of the conduction rails 410. Accordingly, a conduction flow path (a1) is provided and begins on the thermal conduction frame of the circuit card 420 and passes through the thermal joint between the circuit card and the card guide rails 270a, 270b. The heat flow path continues at (a2) through the outer structural layer 412 of the conduction rail 410, and into the inner core 411 of the conduction rail 410. Heat is conducted along portion (a3) of the flow path down the inner core 411 in a downward direction and into the inner core inserts 461 of the base 460 at thermal joint 411a between the inner core 411 of the conduction rails 410 and the inner core inserts 461 of the base 460. In the present example, where the heat exchanger element comprises a cold plate 390 thermally coupled to the base 460, the heat flow path (a4) continues through the lower panel 462a of the base 460 (see FIG. 6C), and, is distributed there to a heat-distribution element, such as the external temperature-managed cold plate 390 described herein. Such heat flow path segments (a1, a2, a3, a4) can be present for each card slot in the enclosure system and can operate as an efficient mechanism for removing heat from all circuit cards 420 mounted in the system.

In this manner, the present configuration including the outer structural layer 412 and the inner core 411 of the conduction rails 410a, 410b and the outer structural layer 462 and the inner core 461 of the base 460 can collectively conduct heat in a more efficient manner than conventional conduction-cooled enclosures while maintaining structural integrity. This solution provides an enclosure having reduced weight and having improved heat removal properties.

Figure 6D:
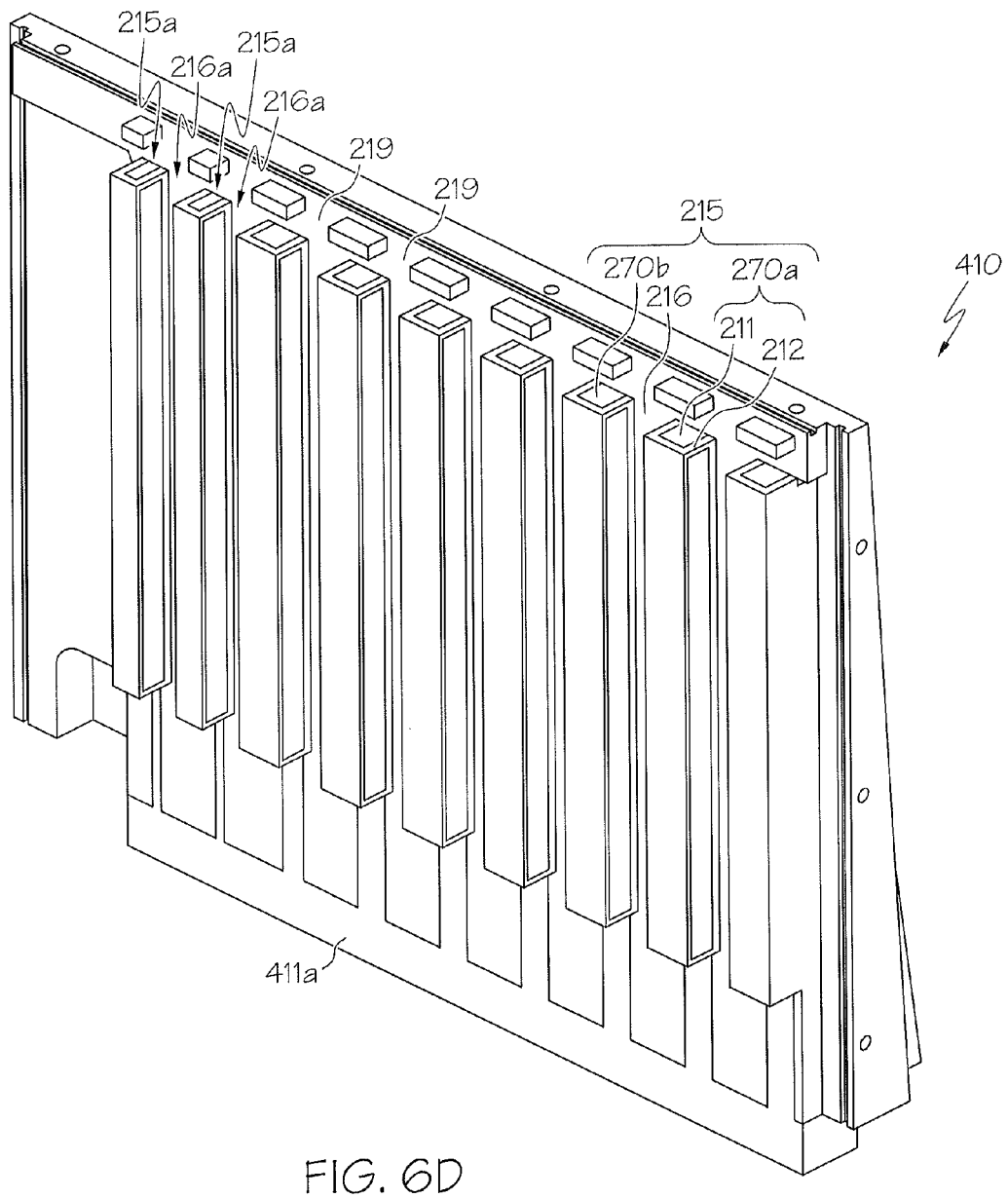
FIG. 6D is a perspective view and FIG. 6E is a sectional side view of a configuration of the conduction rails including inner cores and outer structural layers arranged according to another embodiment of the present inventive concepts.
Figure 6E:
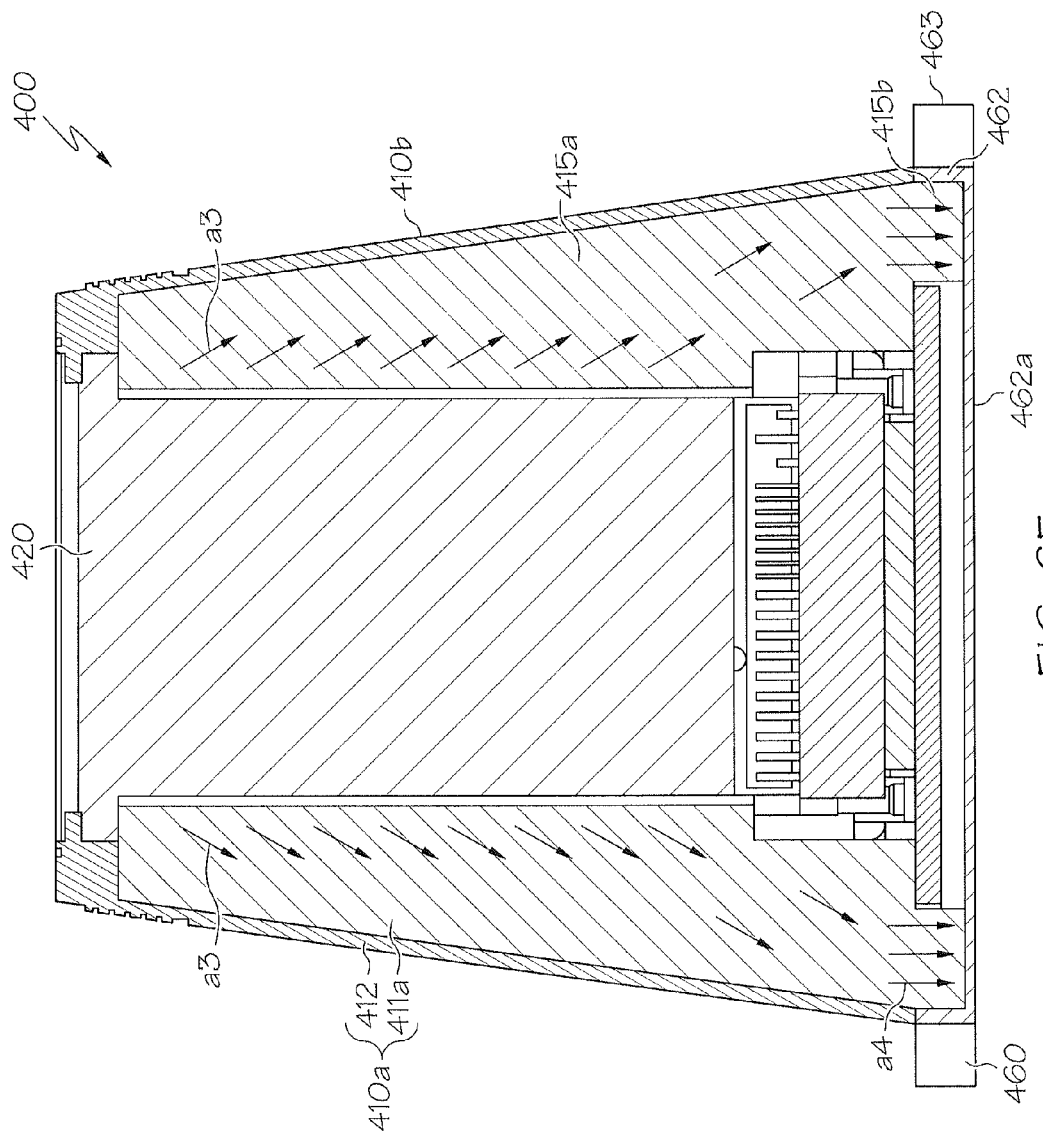

FIG. 6D is a perspective view and FIG. 6E is a sectional side view of a configuration of the conduction rails 410 including inner cores 411a and outer structural layers 412 according to another embodiment of the present inventive concepts. In this embodiment, the inner core portions 411a of the conduction rails have a lower portion 415b that extends directly into the base 463, so that the inner core portions 411a of the conduction rails make direct thermal contact with the lower panel 462a of the base. The lower portion 415b is unitary with the upper portion 415a so that a thermal joint 411a (see the embodiment of FIG. 6C, described above) between the portions is not necessary. The absence of such a thermal joint can operate to improve the overall efficiency of the heat flow path of the enclosure.

Figure 7A:
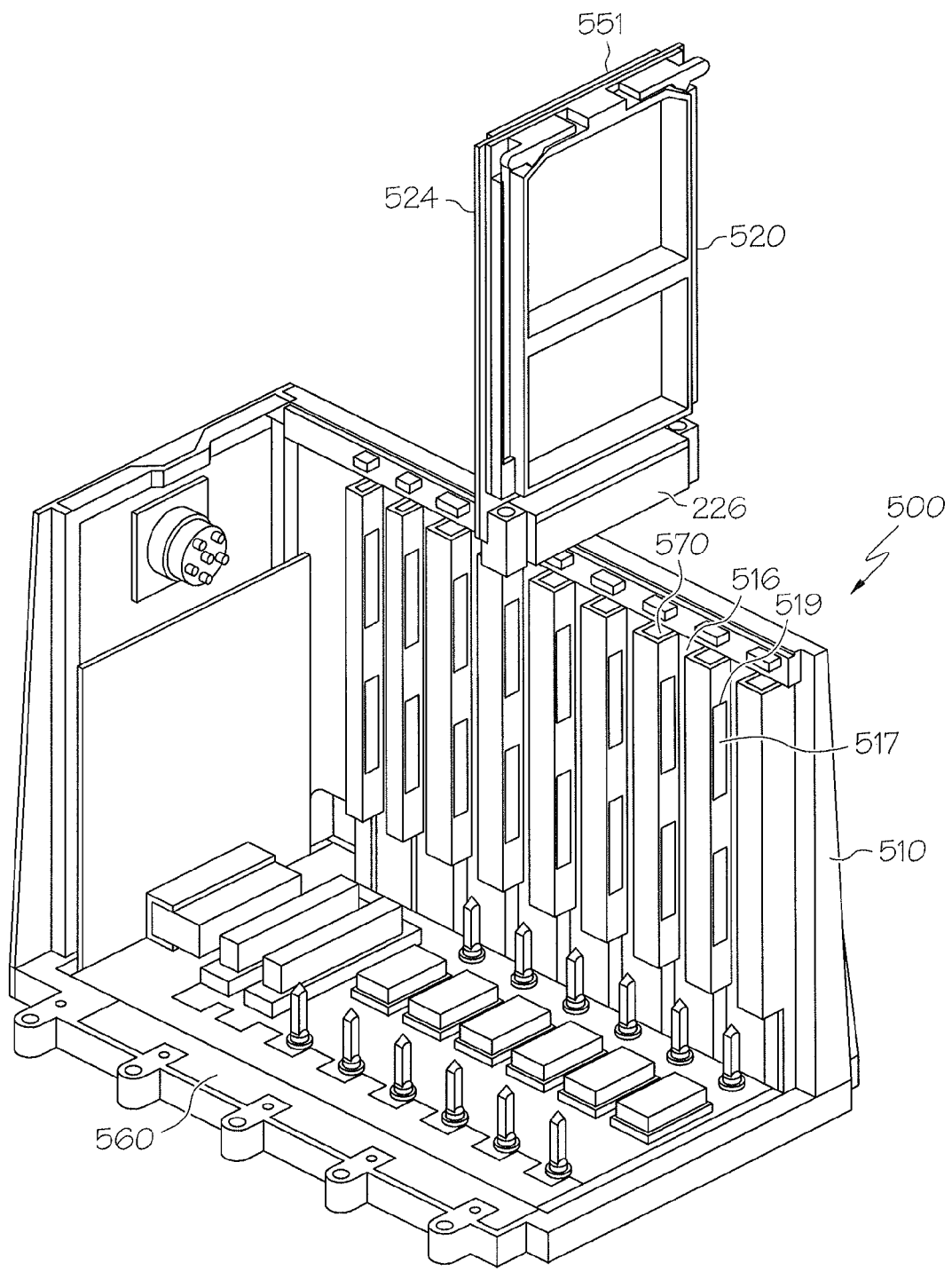
FIG. 7A is a cutaway perspective view of an embodiment of an enclosure system further including a thermal interface material (TIM) positioned in card guide rails of the conduction rails, in accordance with aspects of the present inventive concepts.
Figure 7B:
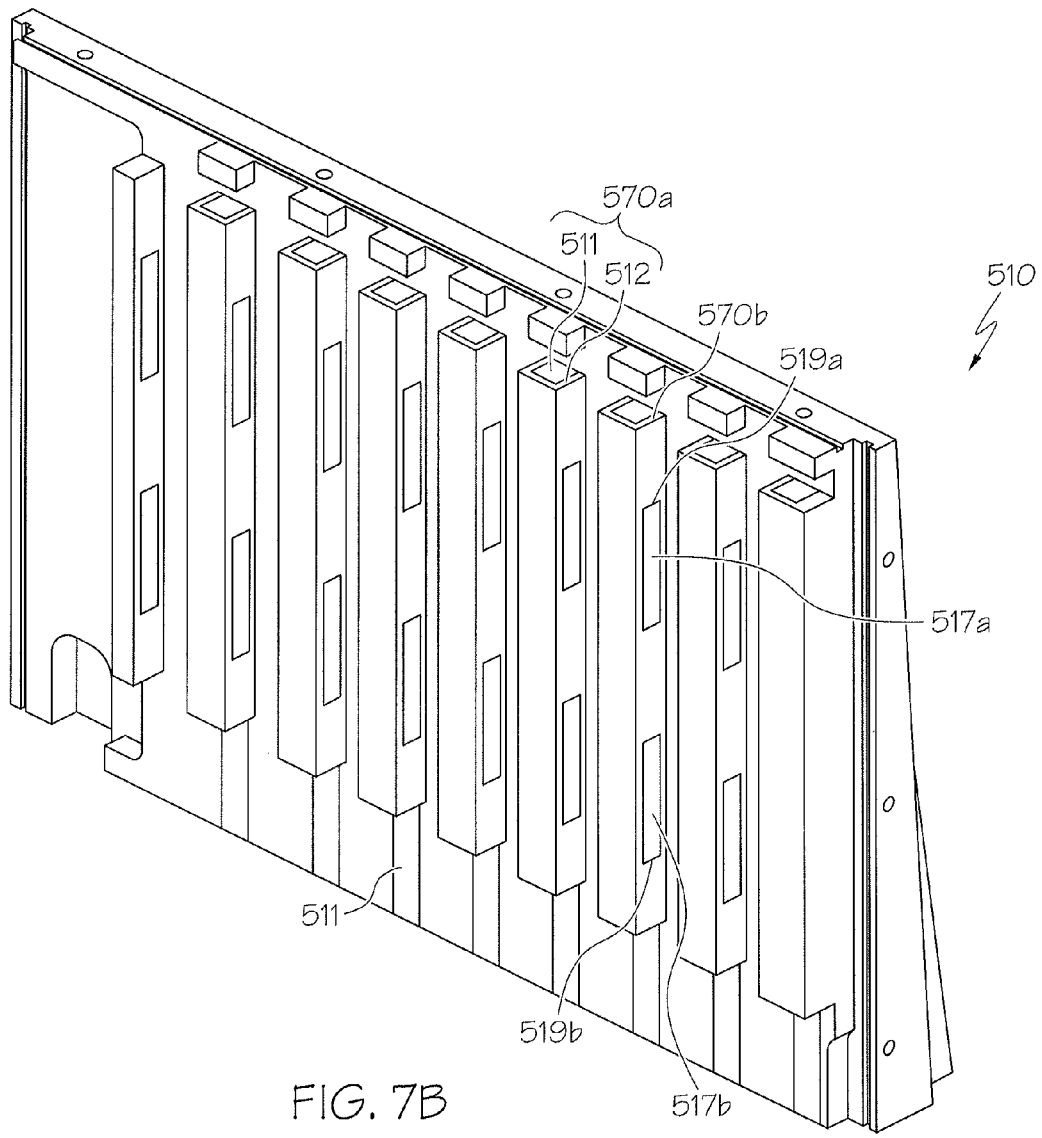
FIG. 7B is a perspective view of an embodiment of a conduction rail of the enclosure system of FIG. 7A including a plurality of thermal interface materials (TIMs) positioned in card guide rails of the conduction rail, in accordance with aspects of the present inventive concepts.
Figure 7C:
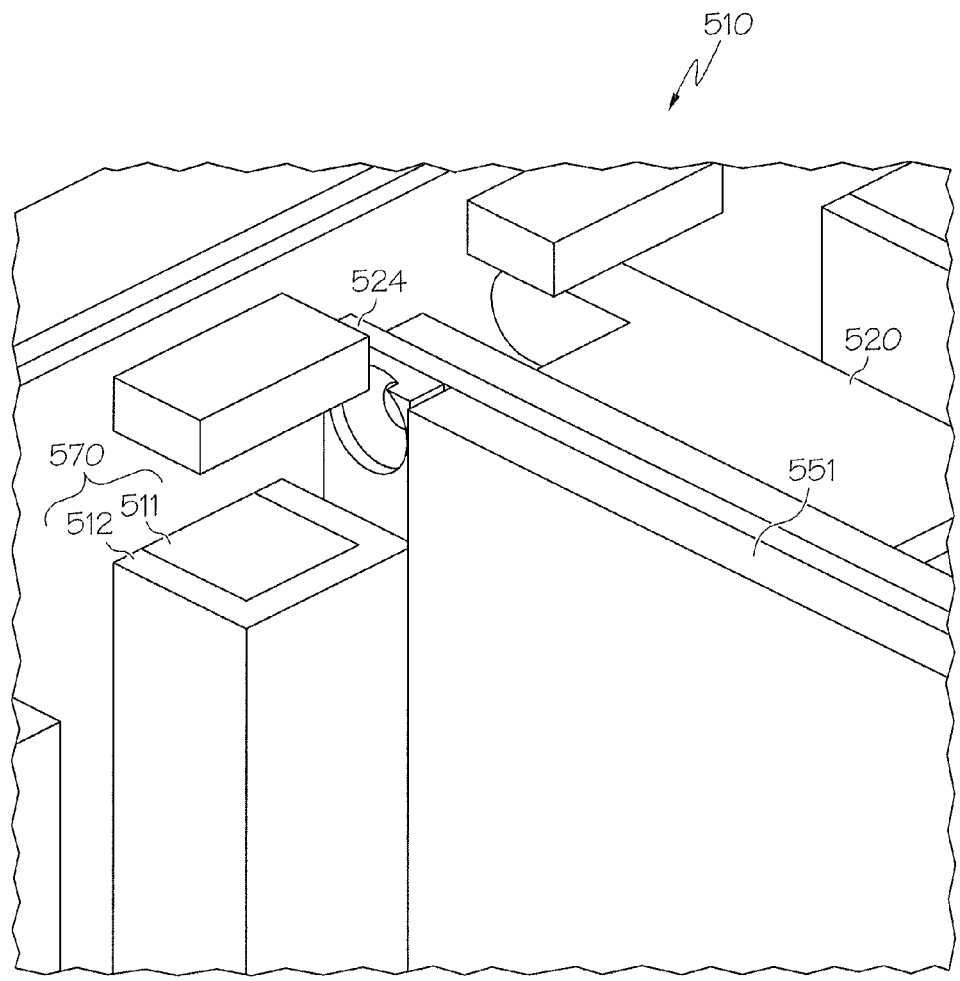
FIG. 7C is a close-up perspective view of a conduction rail of the enclosure system of FIGS. 7A and 7B, in accordance with aspects of the present inventive concepts.
Figure 7D:
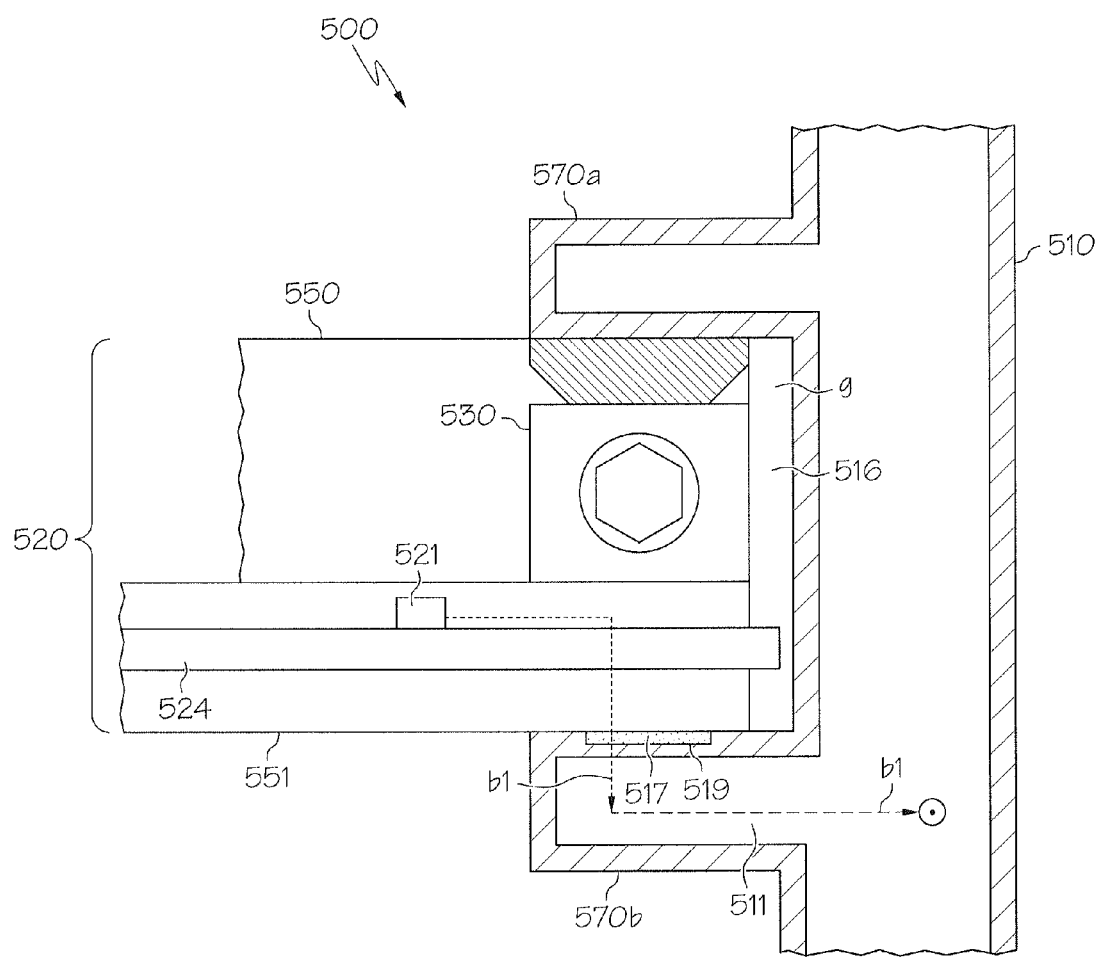
FIG. 7D is an expanded cross-sectional front view of an enclosure system populated with a circuit card that is secured to the enclosure system by a wedge clamp, in accordance with aspects of the present inventive concepts.

FIG. 7A is a cutaway perspective view of an embodiment of an enclosure system 500 including a thermal interface material (TIM) 517 positioned on card guide rails 570 of the conduction rails 510, in accordance with aspects of the present inventive concepts. FIG. 7B is a perspective view of an embodiment of a conduction rail 510 including a plurality of TIMs 517a, 517b positioned on card guide rails 570a of the conduction rails 510, in accordance with aspects of the present inventive concepts. FIG. 7C is a close-up perspective view of the conduction rail 510 illustrating a circuit card 520 secured to the conduction rail 510, in accordance with aspects of the present inventive concepts. FIG. 7D is an expanded cross-sectional front view of an enclosure system 500 populated with a circuit card 520 that is secured to the enclosure system 520 by a wedge clamp 530, in accordance with aspects of the present inventive concepts.

The embodiments of FIGS. 7A-7D are similar to other embodiments described herein, except that FIGS. 7A-7D include a card guide rail 570 having one or more controlled-volume cavities 519, also referred to as a thermal interface pocket, and a TIM 517 positioned in the cavity 519. In some embodiments, the controlled-volume cavity 519 and TIM 517 are constructed in a manner similar to those described in U.S. patent application Ser. No. 12/556,293 by Robert C. Sullivan, et al., filed Sep. 9, 2009, entitled "Devices Having a Thermal Interface and Methods of Forming the Same," the contents of which are incorporated herein by reference in their entirety.

In an embodiment, the enclosure system 500 comprises a conduction rail 510 coupled to a base 560. A circuit card 520 can be inserted into the enclosure system 500. The circuit card 520 can comprise a substrate 524 populated by a plurality of electronic components 521. The circuit card 520 can include a conduction frame 550 positioned on the substrate 524, and can further include a conduction plate 551 coupled to a bottom surface of the substrate 524.

As shown in FIG. 7B, the conduction rail 510 includes a plurality of card guide rails 570a, 570b, whereby the circuit card 520 can be inserted into a card guide channel 516 between two neighboring card guide rails 570a, 570b.

In an embodiment, an optional card substrate slot can be present in at least a portion of the card guide surface 516 between two card guide rails 570a, 570b, and extend in a same direction of extension as the rails 570a, 570b for receiving the edge of the substrate 524 of the circuit card 520, as described above. A gap (g) (see FIG. 7D) can be present between an edge of the inserted circuit card 520 and a sidewall of the card guide channel 516, wherein an edge of the substrate 524 is positioned in the gap (g).

The conduction rail 510 of the present embodiment can include an inner core 511 of highly thermally conductive material and an outer structural layer 512 positioned on the inner core 511, as described herein As illustrated, each card guide rail 570 can include along its body at least a portion of the inner core 511 and the outer structural layer 512. Accordingly, the outer surface of the conduction rail 510, including the card guide rails 570 and card guide channel 516 can be composed of the outer structural layer 512. In another embodiment, the inner core 511 is at least partially surrounded by the outer structural layer 512 in the regions of the card guide rails 570. In one embodiment, the inner core 511 and outer structural layer 512 can comprise inner core materials, structural materials, and composite materials described herein with regard to other embodiments, and can be arranged and configured in a manner to that described herein in connection with other embodiments.

As shown in FIG. 7D, the circuit card 520 can further comprise a wedge lock 530, also referred to as a wedge clamp, which secures the circuit card 520 between the neighboring, opposed, inner walls of the pair of parallel card guide rails 570a, 570b. The wedge lock 530 can be activated to provide sufficient pressure to ensure that a proper thermal joint interface is formed between the thermal conduction frame 550 and/or conduction plate 551 of the circuit card 520 and the enclosure system 500.

In an embodiment, the TIM 517 is inserted into one or more controlled-volume cavities 519 of the guide rail 570 to reduce thermal resistance at the thermal joint interface between the wedge lock 530 of the circuit card 520 and the conduction rail 510 of the enclosure system 500. In other embodiments, the TIM 517 can be positioned in a controlled-volume cavity (not shown) in a conduction plate 551 of the circuit card 520. In other embodiments, the TIM 517 can be positioned in a controlled-volume cavity (not shown) in the wedge lock 530. This feature is particularly beneficial in regions of the enclosure system 500 where low thermal resistance is important. The controlled volume cavity pockets can be located on the most effective side, or on both sides, of the sidewalls of the card guide rails to ensure proper thermal flow.

The controlled-volume cavity 519 is dimensioned to provide precise control over the compression of the TIM when a circuit card 520 is inserted into the card guide surface 516 between the two card guide rails 570 and compresses the TIM 517 against the walls of the controlled-volume cavity 219. In one embodiment, the controlled-volume cavity 219 can have a depth in the outer structural layer 512 of a card guide rail 570 of 0.004 inches. In another embodiment, the outer structural layer 512 has a thickness of 0.08 inches. In another embodiment, the cavity 219 can have dimensions of 0.283 inches (width)×5.054 inches (length)×0.004 inches (depth).

In another embodiment, the TIM 517 can be constructed to directly abut the inner core material 511 in the card guide rail 570. For example, the controlled volume cavity can be formed to a depth in the outer structural layer 512 so as to expose the underlying inner core material 511. In another embodiment, a portion of the body of the outer structural layer 512 is present between the TIM 517 and the inner core material 511 such that the TIM 517 is physically separated from the inner core material 511.

In the embodiments shown in FIGS. 7A, 7B, a plurality of discrete controlled-volume cavities 519a, 519b can extend along a majority of the length of the card guide rail 570 on at least one side of the card guide rail 570, and each cavity 519a, 519b can include a corresponding TIM 517a, 517b, respectively. In other embodiments, the controlled-volume cavity 519 can take the form of a single cavity that extends along a majority of the length of the card guide rail 570 on at least one side of the card guide rail 570.

In an embodiment, the TIM 517 is an elastomer-based TIM. In another embodiment, the TIM 517 is a wax-based TIM. In another embodiment, the TIM 517 is a polymeric TIM. In another embodiment, the TIM 517 comprises nanotube materials. In another embodiment, the TIM 517 comprises diamond materials. In another embodiment, the TIM 517 comprises phase-change materials adhered to a foil or other substrate. In other embodiments, the TIM 517 comprises one or more conductive materials, such as metals, for example, malleable metals. In other embodiments, the TIM 517 comprises materials that permit a low thermal resistance interface path to be formed between electronic components 521 on the circuit card 520 and the enclosure system 500, thereby enhancing heat transfer between the circuit card 520 and the enclosure system 500.

Accordingly, in the embodiments related to FIGS. 7A-7D, a conduction rail 510 of an enclosure system 500 can permit heat to be efficiently dissipated from a circuit card 520 positioned in the system 500 to a conduction rail 510 of the system 500, while also offering low thermal resistance at a thermal joint interface between the circuit card 520 and the conduction rail 510. These features are illustrated at least at FIG. 7D, in which a first conduction flow path (b1) extends from the conduction plate 551 of the circuit card 520, through the TIM 517, through the wall of the conduction rail at the controlled-volume cavity 519, to the inner core 511 in the conduction rail 510, where the thermal path (b1) turns to extend into the page in a direction toward the base.

Figure 8A:
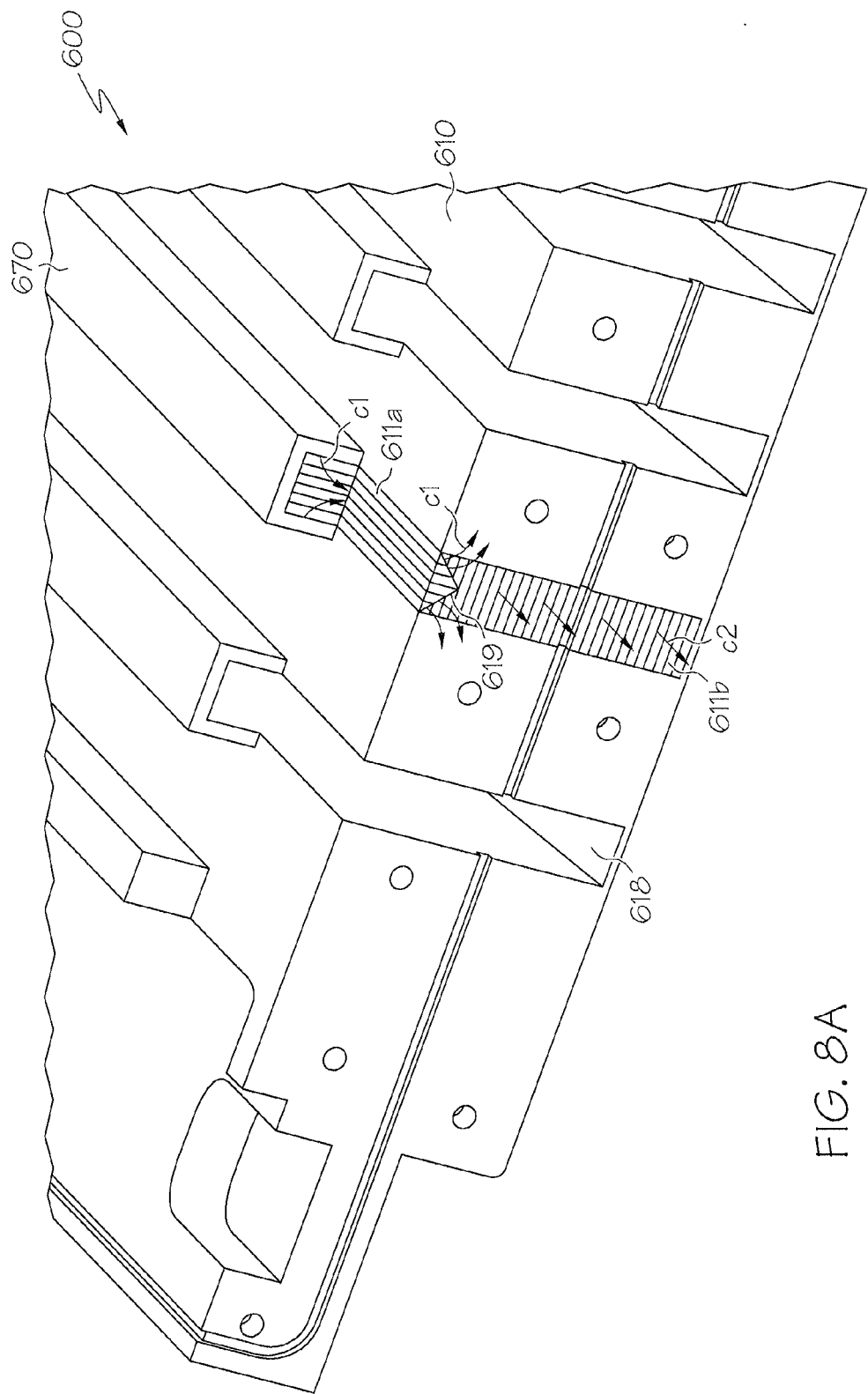
FIG. 8A is a cutaway perspective view of an enclosure system including an inner core of a material having grain structures that are oriented in multiple grain directions, in accordance with aspects of the present inventive concepts.
Figure 8B:
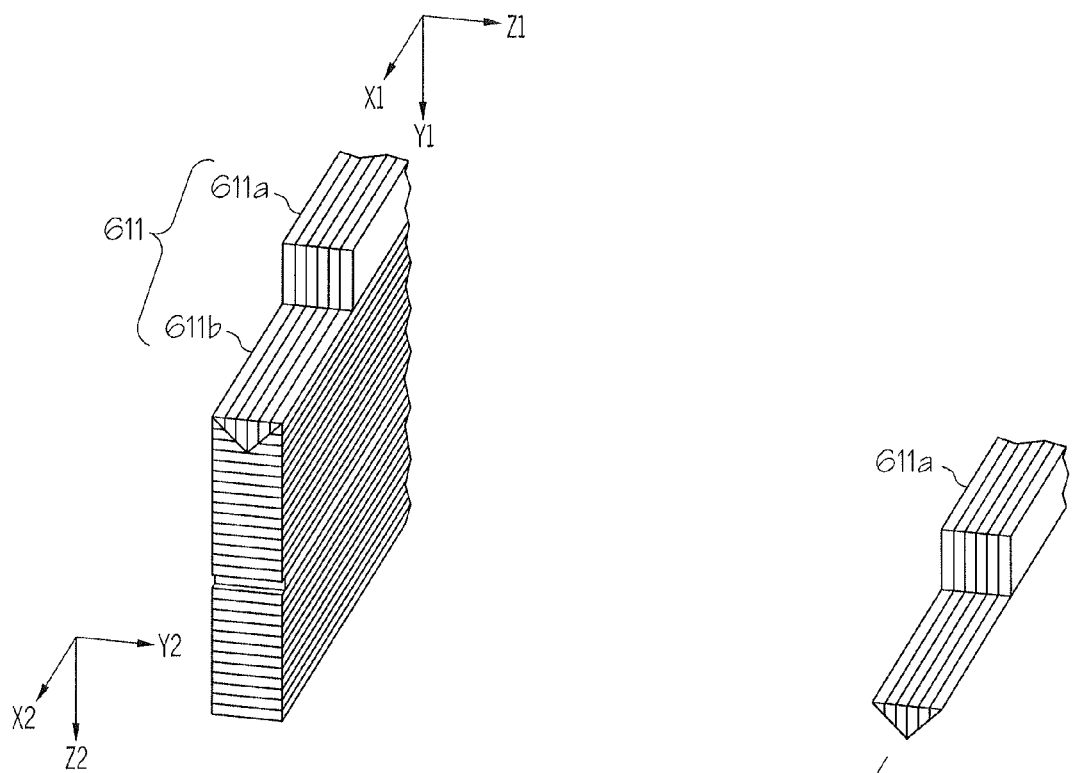
FIG. 8B is a perspective view of the inner core separated from the enclosure system of FIG. 8A.
Figure 8C:
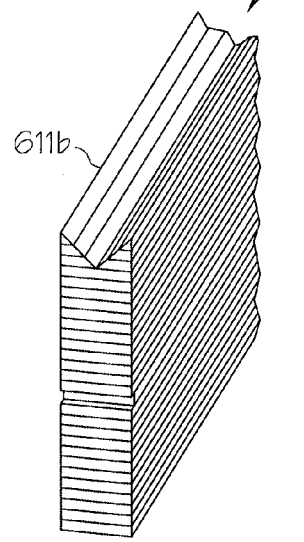
FIG. 8C is a perspective view of the inner core of FIG. 8B including a first inner core portion separated from a second inner core portion.

FIG. 8A is a cutaway perspective view of an enclosure system 600 including an inner core 611 of a material having grain structures that are oriented in multiple grain directions, in accordance with aspects of the present inventive concepts. FIG. 8B is an exploded perspective view of the inner core 611 separated from the enclosure system 600 of FIG. 8A. FIG. 8C is an exploded perspective view of the inner core 611 of FIG. 8B including a first inner core portion 611a separated from a second inner core portion 611b.

Each inner core portion 611a, 611b described in connection with the present illustrative embodiment can be formed of materials that are the same as, or similar to, those described with regard to inner cores herein.

The materials used to form the inner core 611 may have a high level of sensitivity in performance with respect to grain orientation, or fiber orientation, of these materials. For example, the materials can exhibit transverse isotropic thermal properties that are highly thermally conductive in the planar grain direction, and have reduced thermal conductivity in the vertical direction. By forming the inner core materials to have suitable grain orientations, efficient heat flow characteristics can be promoted in the resulting system.

Accordingly, in the present example embodiment, the first and second inner core portions 611a, 611b are oriented in different grain directions with respect to each other. For example, the first inner core portion 611a is oriented in an "x1" grain direction and a "y1" grain direction, or x1-y1 planar direction, which are grain directions having maximum thermal conduction and optimal heat-spreading characteristics. The "z1" grain direction, or vertical grain direction, shown in FIG. 8B, on the other hand, exhibits relatively low thermal conductivity. At the same time, the second inner core 611b is configured to have a different grain orientation than that of the first inner core 611b, i.e., an "x2" grain direction and a "y2" grain direction, or x2-y2 planar direction, which are grain directions having maximum thermal conduction and optimal heat spreading characteristics. The "z2" grain direction, or vertical grain direction, shown in FIG. 8B, on the other hand, exhibits relatively low thermal conductivity. In this manner, grains of the first inner core portion 611a are oriented so that the x1-y1 planar direction is generally the same as, or parallel to, a direction of longitudinal extension of the guide rail 670 of the conduction rail 610. In this manner, thermal conductivity is promoted in a direction from the body of the guide rail 670 toward an inner portion of the inner core potion of the conduction rail 610, according to arrows C1. Grains of the second inner core portion 611b are oriented in a direction that is normal to the direction of orientation of the grains of first inner core portion 611a. Heat that is distributed from the guide rail regions 670 is transferred to the second inner core portion 611b, which is optimized to transfer heat in the x2-y2 planar direction, or in a direction toward the base plate of the enclosure system according to arrows C2.

In other embodiments, the planar grain orientations of the first and second inner core portions 611a, 611b can be oriented in directions that are at acute angles relative to each other. In other embodiments, the first and second inner core portions 611a, 611b are oriented in directions, for example, x1-y1 and x2-y2 grain directions, respectively, that permit high thermal conductivity to occur by optimally spreading and transferring heat that is dissipated to the conduction rail 610 of the enclosure system 600. In other embodiments, the base of the enclosure system 600 can include inner core inserts having grain orientations that optimize thermal conduction and heat spreading characteristics in a similar manner.

In an embodiment, the first and second inner core portions 611a, 611b are coupled to each other at an interface 619, which, in an embodiment, can be a mitered joint. In this configuration, the inner core portions 611a, 611b can be separately manufactured and assembled together. In an embodiment, the inner core portions 611a, 611b can be bonded together using various bonding techniques such as brazing, welding, adhesive bonding, or ultrasonics. In another embodiment, the inner core portions 611a, 611b can be pre-formed, coupled together, and inserted into cavities 618 of the conduction rail 610 corresponding to card guide rails 670 extending from the conduction rail 610. In other embodiments, the inner core portions 611a, 611b can be pre-formed and coupled together to form the inner core 611, and an outer structural layer can be cast about the inner core 612, and machined to form the conduction rail 610.

In the embodiments described above, an inner core 611 can be constructed and arranged to have multiple sections, each section formed of a material having grains that are oriented in a direction that permits conduction flow paths to be managed and controlled for optimal conduction-cooling. In an embodiment as shown in FIGS. 8A and 8B, an inner core 611 can have sections that are oriented in alternate grain directions, permitting conduction flow paths (c1, c2) to be managed and controlled for optimal conduction-cooling. For example, conduction flow path (c1) extends from an electronic component (not shown) abutting the card guide rail 670 to the first inner core portion 611a, which is oriented in the x1-y1 grain direction, which includes grain directions having maximum thermal conduction and optimal heat spreading characteristics. Further, a conduction flow path (c2) extends from the first inner core portion 611a to the second inner portion 611b, which is oriented in the x2-y2 grain direction, also including grain directions having maximum thermal conduction and optimal heat spreading characteristics. Accordingly, the conduction flow paths (c1, c2) can optimally direct heat to be dissipated via a conduction rail 610 of the enclosure system 600.

In other embodiments, the inner core 611 can have sections or portions formed of a material having grains oriented in grain directions that are normal to the direction of extension of a conduction rail, base, or other thermally conductive component of the enclosure system 600. In other embodiments, the sections of the inner core 621 can be formed of material having grains oriented in the same grain direction as shown in FIGS. 9A, 9B.

Figure 9A:
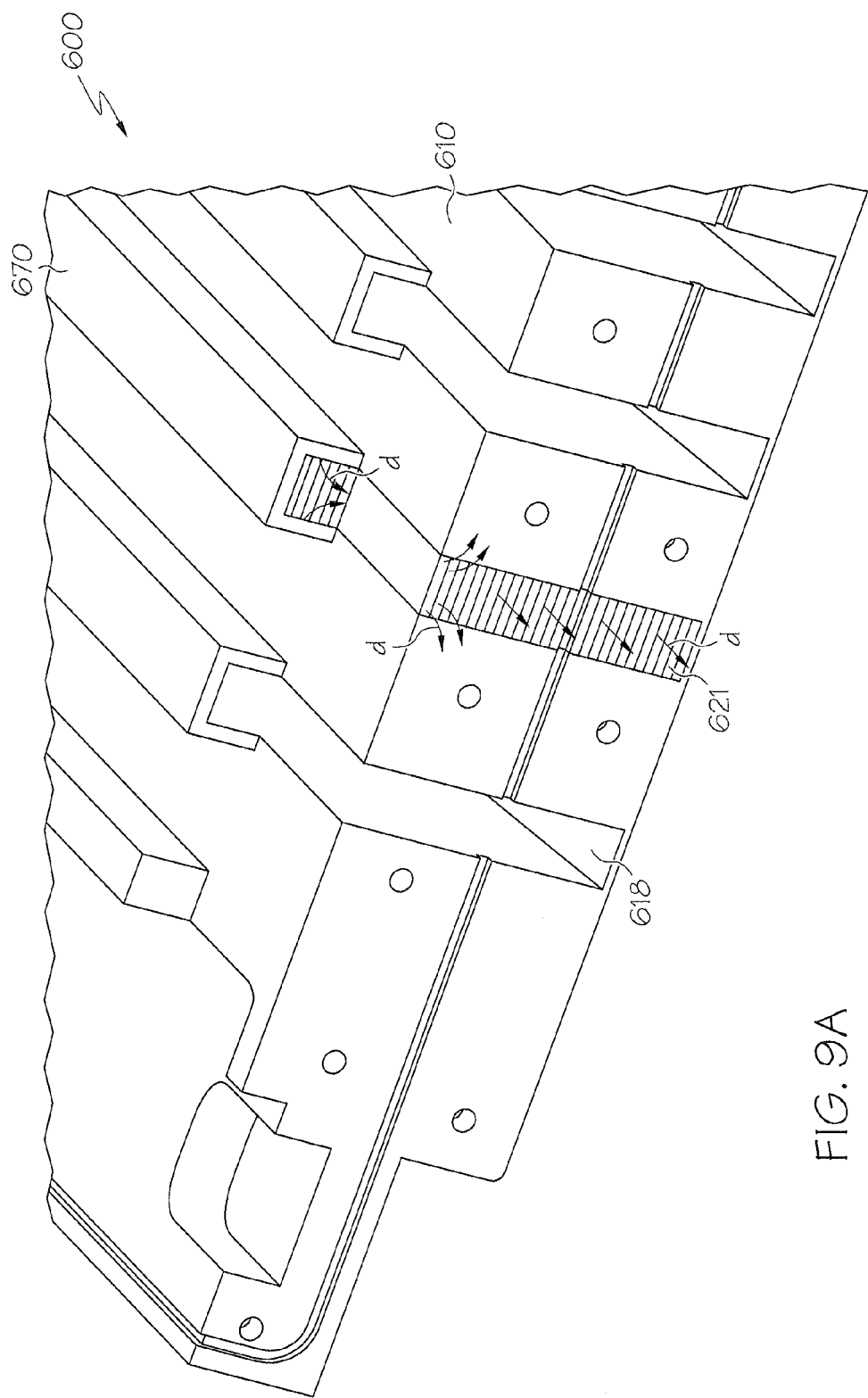
FIG. 9A is a cutaway perspective view of an enclosure system including a partial inner core oriented in at least one grain direction, in accordance with aspects of the present inventive concepts.
Figure 9B:
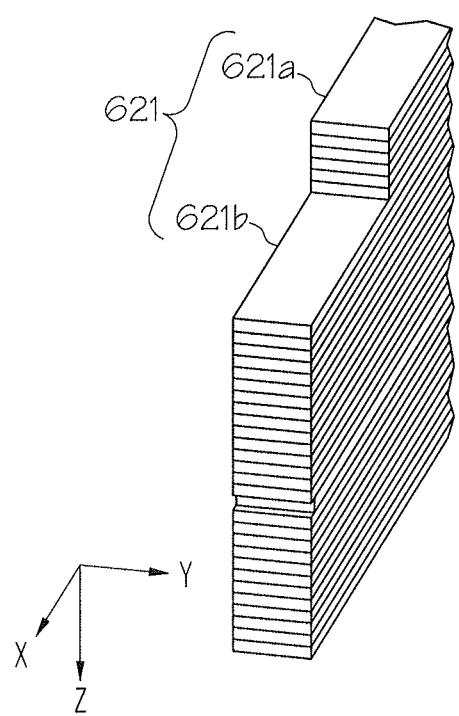
FIG. 9B is a perspective view of the partial inner core of FIG. 9A separate from the enclosure conduction rail.

With regard to FIGS. 9A, 9B, a conduction flow path (d) can extend from an electronic component (not shown) abutting a card guide rail 670 to the inner core 621, which is oriented in the x-y planar grain direction, which includes planar grain orientations having maximum thermal conduction and optimal heat spreading characteristics, as described above. The z-grain direction shown in FIGS. 9A, 9B, on the other hand, has relatively low thermal conductivity as compared to the x and y grain directions. Accordingly, the conduction flow path (d) is configured to direct heat in a vertical direction through the conduction rail 610 of the enclosure system 600.

Figure 10A:
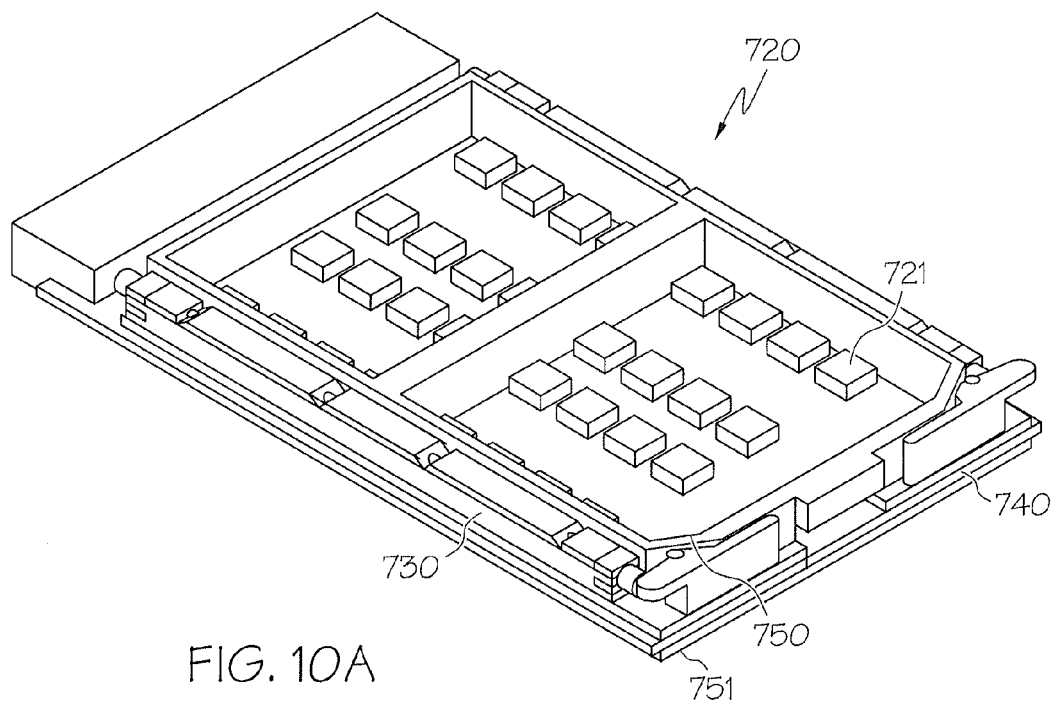
FIG. 10A is a perspective view of a circuit card including an inner core and an outer structural layer, in accordance with aspects of the present inventive concepts.
Figure 10B:
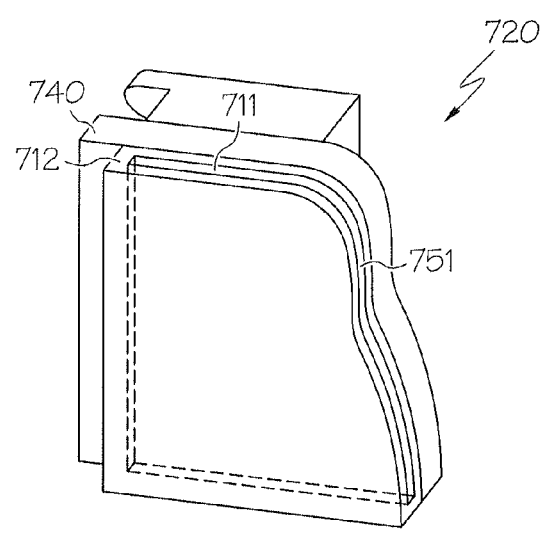
FIG. 10B is a close-up partial perspective view of the circuit card of FIG. 10A.

FIG. 10A is a perspective view of a circuit card 720 including an inner core and an outer structural layer, in accordance with aspects of the present inventive concepts. FIG. 10B is a close-up partial perspective view of the circuit card 720 of FIG. 10A. In one embodiment, the circuit card 720 is a conduction-cooled circuit card assembly (CCA).

In the present illustrative embodiment, the circuit card 720 comprises a substrate 740 on which is populated a plurality of electronic circuits 721. The circuit card 720 includes a conduction frame 750 to which the substrate 740 is mounted. Hot components populating the substrate are thermally mounted directly to the conduction frame 750 which operates to conduct heat away from the electronic circuits 721 to the wall of the chassis, as described herein. The circuit card 720 can further comprises a conduction plate 751 coupled to a bottom surface of the substrate 740, the conduction plate being in thermal communication with the conduction frame 750 by a plurality of thermally conductive contacts between the frame 750 and plate 751 formed through vias in the substrate 740. In an embodiment, a portion of the conduction frame 750 is coupled to a top surface of the substrate 740 between the optional wedge clamp 730 and the substrate 740.

In an embodiment, the conduction plate 751 includes an inner core of material having enhanced thermal conductivity 711 and an outer structural layer 712 on the inner core 711. The outer structural layer 712 can be formed to encapsulate the inner core 711. In one embodiment, the inner core 711 and outer structural layer 712 are each formed of materials the same as, or similar to, those described herein in connection with the inner cores and outer structural layers of the body of the enclosure. Accordingly, the resultant composite structure includes a thermally enhanced material that provides structural characteristics as well as high thermal conductivity properties.

As described, the composite structure comprising the inner core 711 and outer structural layer 712 can be machined to form a conduction plate 751 of a circuit card 720. In other embodiments, the conduction frame 750 can include the inner core 711 and outer structural layer 712. In other embodiments, the wedge clamp 730 can include the inner core 711 and outer structural layer 712.

Figure 11:
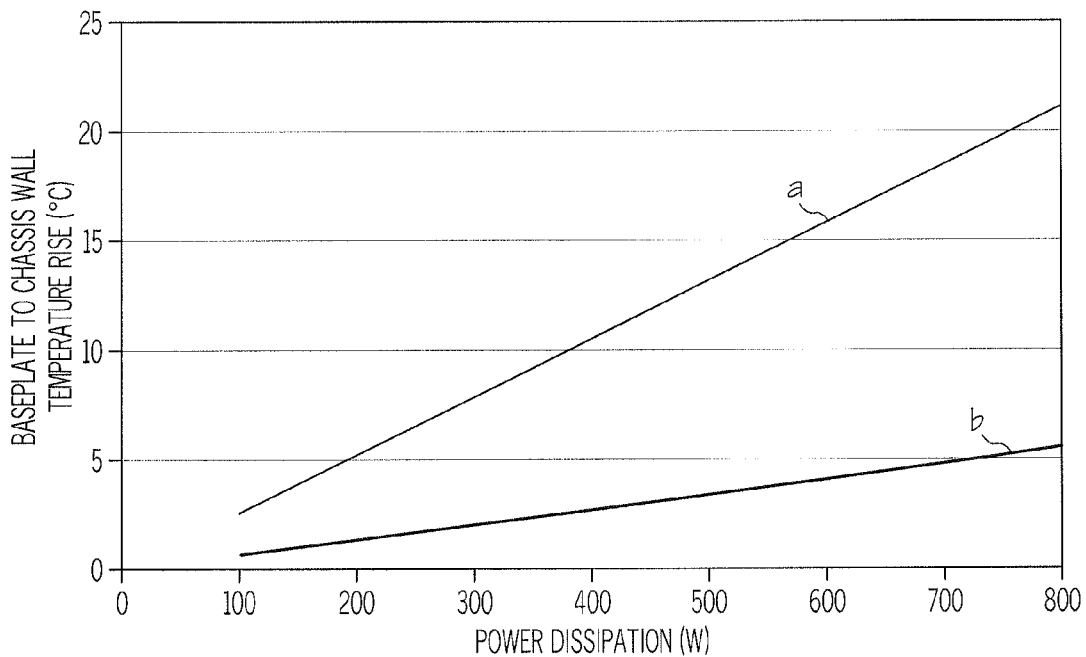
FIG. 11 is a graph comparing power dissipation characteristics of an enclosure system according to aspects of the present inventive concepts and a conventional conduction-cooled card cage.

FIG. 11 is a graph comparing power dissipation characteristics of an enclosure system according to aspects of the present inventive concepts and a conventional conduction-cooled card cage.

As described herein, electronic components on circuit cards can generate a substantial amount of heat within an enclosure such as a card cage. Line (a) of the graph shown in FIG. 11 illustrates a temperature increase at an aluminum chassis wall of a conventional card cage, and line (b) illustrates a temperature increase at a chassis wall of an enclosure system, including a composite structure comprising an outer structural layer and an inner core as described in connection with the present embodiments. As shown in FIG. 11, the enclosure system comprising the composite structure dissipates power with significantly more efficiency than the conventional card cage. For example, in a conventional card cage, a power dissipation of 500 W corresponds to a baseplate to chassis wall temperature rise (~4° C.) that is significantly less than a corresponding baseplate to chassis wall temperature rise in a conventional card cage (~13° C.). Thus, even when power levels of components inside the card cage, e.g., circuit cards, motherboard, etc., generate significant heat, for example, 700 W in FIG. 11, the generated heat can be sufficiently removed from the enclosure system by a sidewall and/or base having a composite structure, such that the enclosure system can have an acceptable operating temperature.

Figure 12:
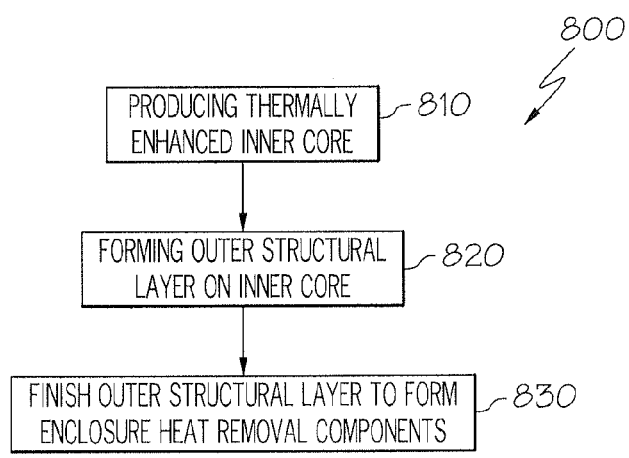
FIG. 12 is a flow diagram depicting an embodiment of a method of cooling a card cage, in accordance with aspects of the present inventive concepts.

FIG. 12 is a flow diagram depicting an embodiment of a method of forming an enclosure system 800, in accordance with aspects of the present inventive concepts. In an embodiment, the method shown in FIG. 12 can be a production-method of fabricating enclosure elements suitable for conduction-cooling. Step 810 includes producing a thermally enhanced inner core. In one embodiment, the inner core is produced in accordance with the production techniques described herein, including machining, molding, casting, adhesive bonding, and other suitable approaches. Step 820 includes forming an outer structural layer of structural material on the inner core. For example, this step can be performed according to the various techniques described herein. Step 830 includes finishing, modifying, or otherwise fabricating the outer structural layer to form enclosure heat removal components, for example, conduction rails and a base. In an embodiment, outer structural layer can be finished by one or more methods, including machining, molding, casting, adhesive bonding, etc., or other machine processes to faun enclosure components. In an embodiment, a machine process can expose the inner core for an intentional interface for the promotion of high thermal conductivity.

Although the highly thermally conductive materials forming an inner core may have poor structural characteristics, when encapsulated by a thin outer structural layer, high structural strength as well as high thermal conductivity and optimal heat spreading can be achieved. Further, as described above, the composite structure formed by the combination of the outer structural material and inner core material can be readily machined or otherwise formed into thermally conductive enclosure elements, such as card cage conduction rails and/or the enclosure base. Further, the composite structure can be configured to have one or more grain orientations for producibility purposes, or manufacturing purposes, further optimizing thermal conductivity and heat spreading. Further, as described above, the overall weight of the enclosure system can be reduced by a corresponding reduction in weight of the thermally conductive enclosure elements.

In an experimental prototype configuration, a base-plate-cooled chassis thermally conductive enclosure was configured in accordance with embodiments described herein. In particular, embodiments described herein were applied to an SFF-6 experimental chassis, of the type available from Curtiss-Wright Controls, Inc., Engineered Packaging Products, Electronic Systems, 151 Taylor Street, Littleton, Mass., 01460. The resulting configuration provided a greater than two-times increase in thermal conductivity at the chassis level. In other words, a greater than two-times decrease in sidewall temperature rise was identified. In one test, for example, a 9 C temperature rise of the chassis wall was observed at 67 W/slot power dissipation. At the same time, a 10 percent weight decrease was identified as compared to an all-aluminum chassis. Performance exceeding that of copper was observed, but without the weight penalty of copper, which can be on the order of a factor of 3. This identified that embodiments described herein are capable of supporting cooling of more than two times the power payload of an all-aluminum chassis.

Figure 13A:
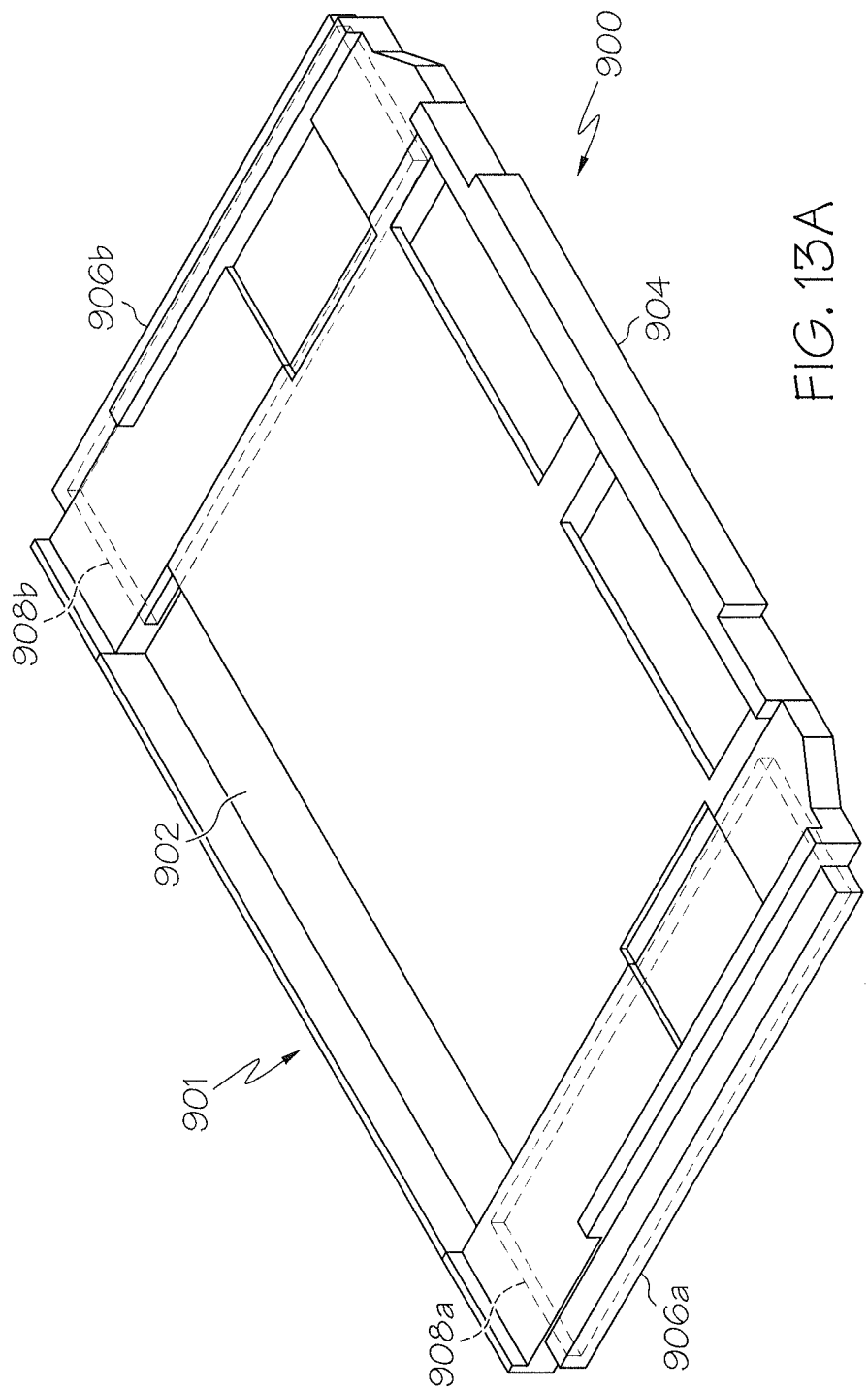
FIG. 13A is a perspective view of a circuit card thermal frame having enhanced thermal flow capabilities, in accordance with aspects of the present inventive concepts.

FIG. 13A is a perspective view of a circuit card thermal frame having enhanced thermal flow capabilities, in accordance with aspects of the present inventive concepts. A circuit card 900 includes a thermal frame 901 that is formed of a thermally conductive and structurally sound material, for example aluminum, Metgraf, or other materials suitable for use for the outer structural layer 212 of the conduction rails 210 described herein. The circuit card 900 includes a primary side 902 and a secondary side 904. Left and right edges of the circuit card 900 include conduction flanges 906a, 906b configured to form a thermal joint with a card guide channel of the enclosure conduction rail, as described herein. In the present embodiment, first and second inner bodies 908a, 908b are encapsulated by an outer body of the thermal frame 901 in regions proximal to the conduction flanges 906a, 906b. In one embodiment, the first and second inner bodies 908a, 908b comprise a material having enhanced thermal conductivity, for example a material that is suitable for use for the inner core 211 of the conduction rails 210 described herein, for example an aluminum graphite (AlGr) material.

Cards such as base cards and mezzanine cards that are eventually mounted to the thermal frame as shown in connection with FIG. 13B below, are not shown in FIGS. 13A, 14, and 15A-C so that other portions of the thermal frame 901 of the circuit card 900 can be visible.

An embodiment of the thermal frame 901 can comprise one or more thermally and/or electrically conductive materials and/or alloys, such as copper, aluminum, gold, etc. In an embodiment, the thermal frame 901 includes Metgraf® 4-230, available from Metal Matrix Cast Composites, LLC, Waltham, Mass. 02453, USA. In another embodiment, the thermal frame 901 can comprise aluminum metal graphite. In another embodiment, the thermal frame 901 can comprise a multiple-layered configuration including a layer of nickel plating. The thermal frame 901 can also comprise a composite material, for example a composite including a carbon-based matrix and a metal. In one example, the carbon-based matrix comprises graphite, and the metal comprises aluminum.

The inner bodies 908a, 908b can comprise a composite material, for example a composite including a carbon-based matrix and a metal. In one example, the carbon-based matrix of the inner bodies 908a, 908b comprises graphite, and the metal of the inner bodies 908a, 908b comprises aluminum. The grains of the inner bodies 908a, 908b can be arranged in planes in the horizontal direction, and the planes can be arranged in multiple layers in the vertical direction. The characteristics of the composite material of the inner bodies 908a, 908b can be optimized so that the inner bodies 908a, 908b have thermal conductive properties that are substantially transverse isotropic. In this sense, the material of the inner bodies 908a, 908b is thermally conductive in the planar direction of the grain layers, while having greatly reduced thermal conductivity in the vertical direction of the grain layers.

The thermal frame 901 can also comprise a composite material, for example a composite including a carbon-based matrix and a metal. In one example, the carbon-based matrix of the thermal frame 901 comprises graphite, and the metal of the thermal frame 901 comprises aluminum. The composite material of the inner bodies 908a, 908b and the composite material of the thermal frame 901 can be designed to have different properties. For example, the thermal frame 901 can be designed to be a stronger structural material than the inner bodies 908a, 908b. At the same time, the material of the thermal frame 901 can have a lower thermal conductivity in the planar direction than the material of the inner bodies 908a, 908b, while exhibiting greater thermal conductivity in the vertical direction than the material of the inner bodies 908a, 908b.

FIG. 13B is a perspective view of the circuit card thermal frame of FIG. 13A illustrating a base card 912 and mezzanine cards 910 mounted to the thermal frame 901. First and second mezzanine cards 910 are mounted to a primary side of the thermal frame 901. The base card 912 is mounted to the secondary side of the frame 901. Electronic components mounted to the cards 910, 912 generate heat that is removed via the thermal frame 901. The components are placed in thermal contact with regions of the thermal frame, for example using thermal putty. In the present embodiment, the first and second inner bodies 908a, 908b promote enhanced thermal conductivity in a direction away from the hot regions of the thermal frame in contact with the hot components, and toward the respective conduction flanges 906a, 906b. In one embodiment, the first and second inner bodies 908a, 908b comprise a material that is optimized for thermal flow in the planar direction of the bodies 908a, 908b. In this manner, thermal flow is promoted in the thermal frame in a direction from the cards 910, 912, through the frame 901 body, through the first and second inner bodies 908a, 908b, to the respective conduction flanges 906a, 906b, where the heat is distributed to the conduction rails 210.

Figure 14:
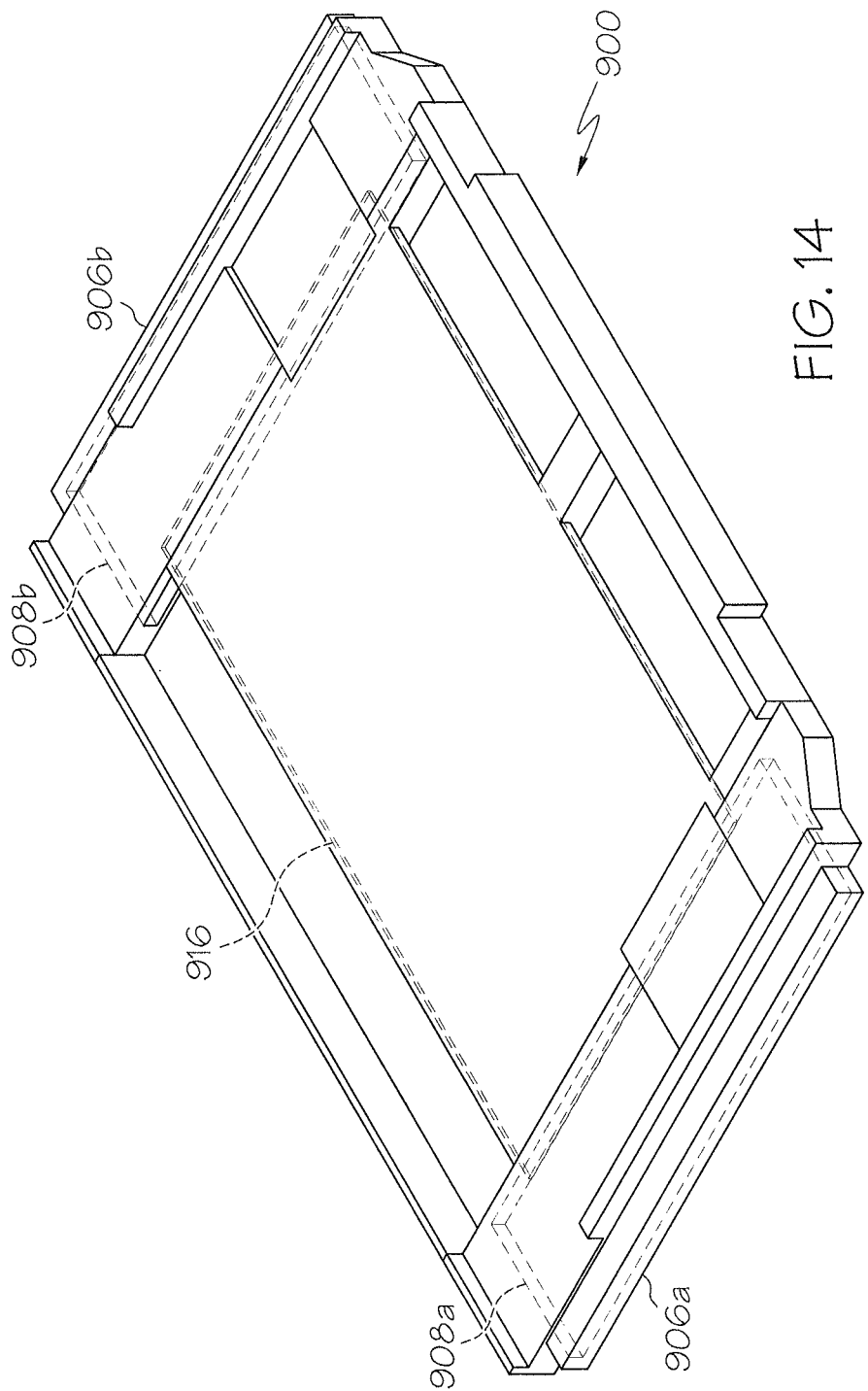
FIG. 14 is a perspective view of a circuit card thermal frame in accordance with another embodiment of the present inventive concepts.

FIG. 14 is a perspective view of a circuit card thermal frame in accordance with another embodiment of the present inventive concepts. In this embodiment, it can be seen that the thermal frame 901 of the circuit card 900 further includes a third inner body 916 that is embedded in the body of the thermal frame in a central region of the circuit card. In this embodiment, the third inner body 916 can comprise a material similar to that of the first and second inner bodies 908a, 908b. The third inner body can operate to further promote thermal flow in the planar direction from the components on the mounted cards 910, 912 toward the conduction flanges 906a, 906b at the edges of the thermal frame 901. In one embodiment, like the first and second inner bodies 908a, 908b, the third inner body 916 can comprise a material that is optimized for thermal flow in the planar direction of the bodies 916. In this manner, thermal flow is promoted in the thermal frame in a direction from the cards 910, 912, through the frame 901 body, through the third inner body 916, through the first and second inner bodies 908a, 908b, to the respective conduction flanges 906a, 906b, where the heat is distributed to the conduction rails 210.

Figure 15B:
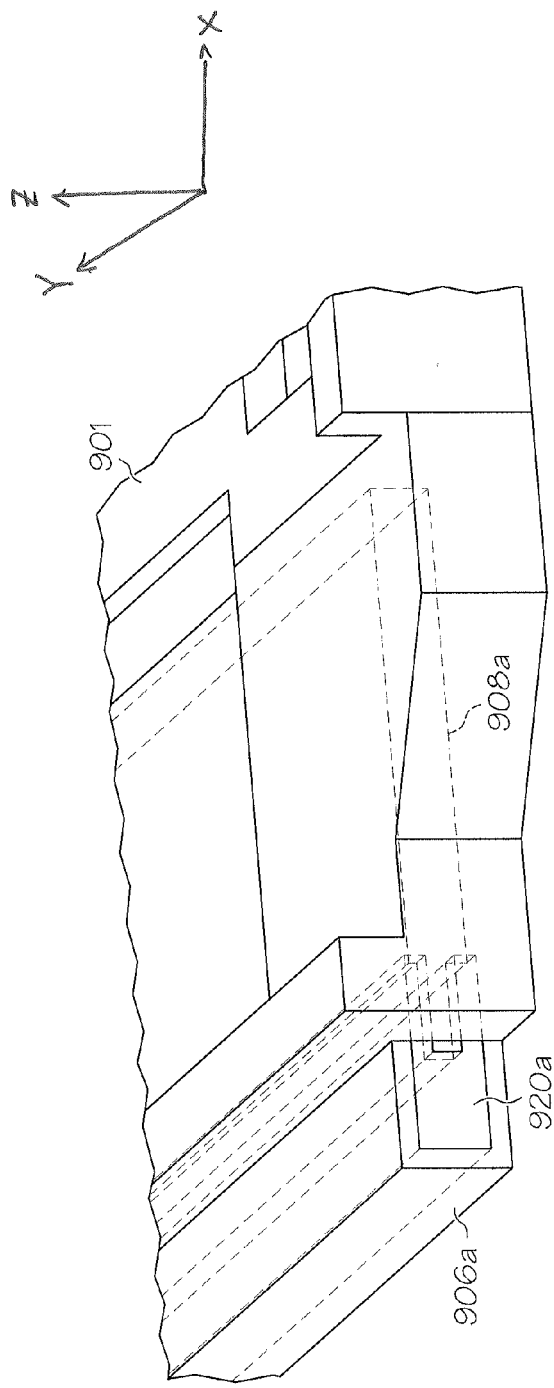
FIG. 15B is a close-up perspective view of an edge of the circuit card thermal frame of FIG. 15A, in accordance with another embodiment of the present inventive concepts.
Figure 15C:
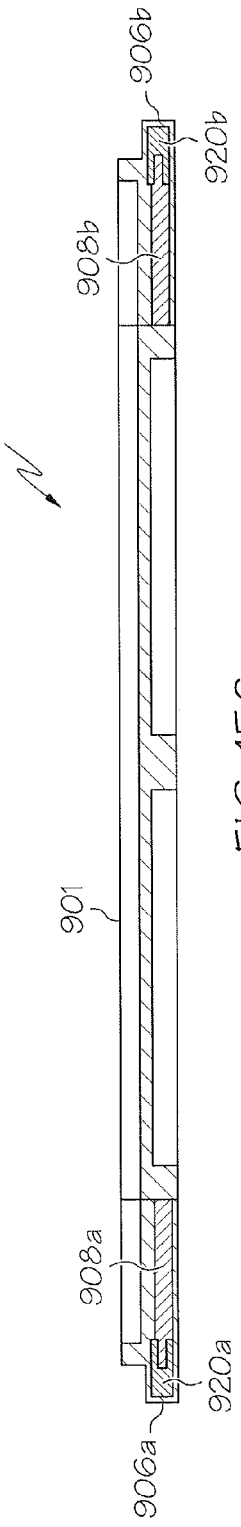
FIG. 15C is a cross-sectional view of an edge of the circuit card thermal frame of FIG. 15A, taken along section line 15C-15C.

FIG. 15A is a perspective view of a circuit card thermal frame, in accordance with another embodiment of the present inventive concepts. FIG. 15B is a close-up perspective view of an edge of the circuit card thermal frame of FIG. 15A. FIG. 15C is a cross-sectional view of an edge of the circuit card thermal frame of FIG. 15A, taken along section line 15C-15C.

In this embodiment, it can be seen that the thermal frame 901 of the circuit card 900 further includes first and second edge inner bodies 920a, 920b that are embedded in the first and second edge regions of the thermal frame 901 and that are in thermal contact with the first and second inner bodies 908a, 908b. In this embodiment, the first and second edge inner bodies 920a, 920b can comprise a material similar to that of the first and second inner bodies 908a, 908b. The first and second edge inner bodies can operate to further promote thermal flow toward the conduction flanges 906a, 906b at the edges of the thermal frame 901. However, in the present embodiment, the first and second edge inner bodies 920a, 920b can comprise a material that is optimized for thermal flow in a vertical direction, or, in other words, in a direction that is normal to the planar direction of the first and second inner bodies 908a, 908b. In this manner, thermal flow that is directed in the planar direction of the first and second inner bodies 908a, 908b is re-oriented in a direction that is normal to the upper and lower surfaces of the conduction flanges 906a, 906b, thereby promoting efficient thermal flow through the thermal joint of the conduction flanges 906a, 906b. Referring to the close-up view of FIG. 15B, grains of the material of the first and second inner bodies 908a, 908b are oriented in the x-y direction to promote thermal flow in the direction of the x-y plane, while grains of the material of the first and second edge inner bodies 920a, 920b are oriented in the y-z direction to promote thermal flow in the direction of the y-z plane. In this manner, heat that flows down the plane of the first and second inner bodies 908a, 908b is reoriented to flow directly into the thermal joint between the conduction flanges 906a, 906b and the card guide rails 270a, 270b.

In various embodiments, embodiments described herein can be employed to enhance the thermal performance of various types of enclosures. These include baseplate conduction cooled, natural convention cooled, forced-air conduction cooled, and liquid conduction cooled chassis. Higher-power, and relatively hotter payloads can be effectively cooled, without increasing weight, and possibly reducing weight, as compared to conventional aluminum construction. Thinner-wall construction can potentially be employed to achieve the same, or better, performance as aluminum construction, while realizing a weight advantage. As described herein, embodiments described herein are further applicable to cooling on the module level, for example by applying the embodiments described herein to conduction-cooled module or convection-cooled module thermal frames. Embodiments can be utilized in a number of applications, including multiprocessing and DSP applications, 3U, Compact PCI, VPX, Open-VPX and VPX-REDI-1 applications, SWaP-C constrained applications, power supply applications, 400 W payload applications, extended-temperature applications, COTS electronic packaging applications.

Figure 17F:
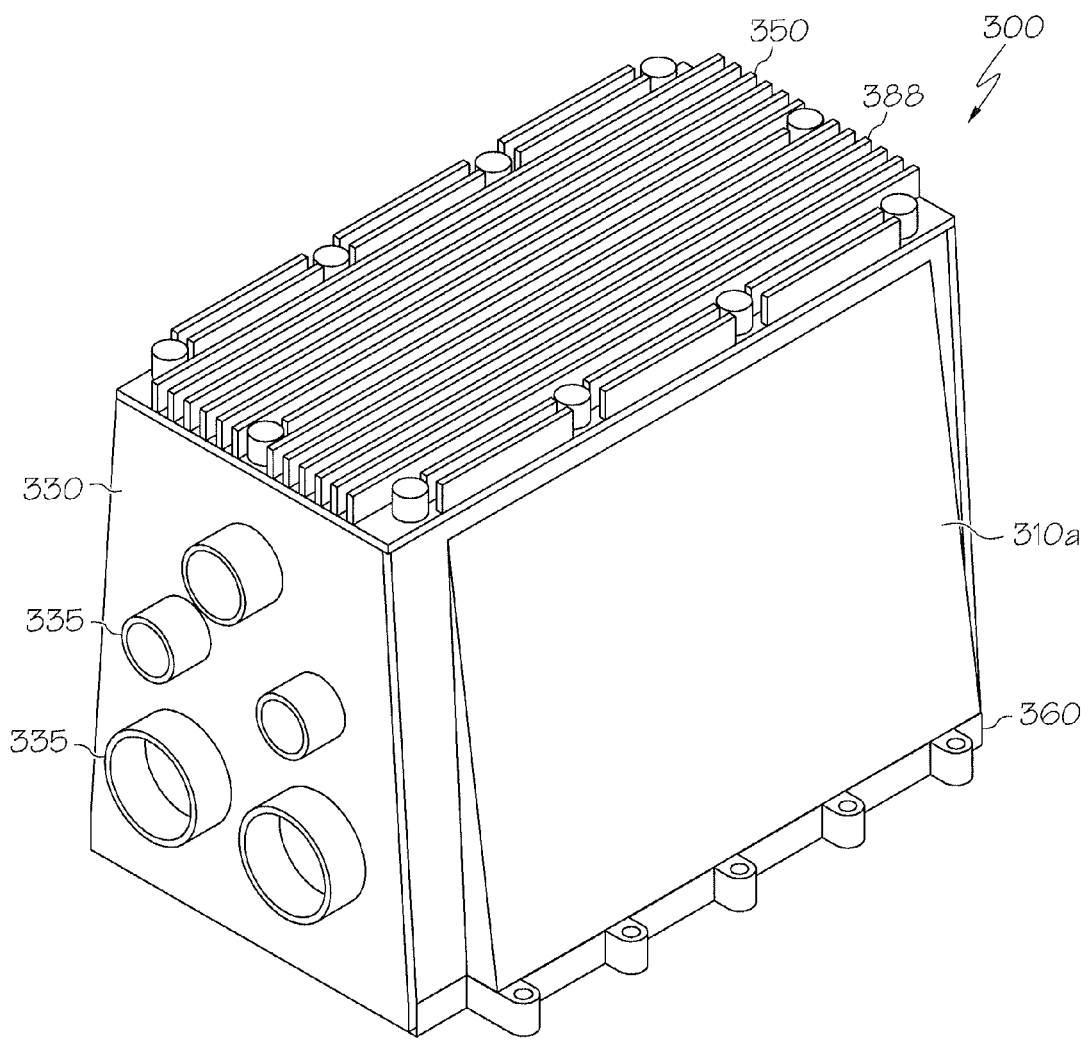

FIGS. 17A1, 17A2, 17B1, 17B2, 17C1, 17C2, 17D1, 17D2, 17E1, 17E2, 17F, 17G and 17H are perspective views of card cages illustrating a variety of heat exchange techniques, in accordance with embodiments of the present inventive concepts. While an example embodiment is provided above, whereby the conduction rails are configured to transport heat into the base plate of the chassis, where the heat is removed by a cold plate, other embodiments for heat exchange are equally applicable to the present embodiments. For example, FIG. 17A1 illustrates a configuration wherein the heat exchanger for the conduction rails 310a takes the form of cooling fins 380 in thermal contact with the conduction rails 310a. In this example, the cooling fins 380 are configured for heat removal by natural convection. In the embodiment depicted in FIG. 17A2, the sidewalls of the conduction rails 310a, 310b have a rectangular outer profile, rather than trapezoidal as in FIG. 17A1. Also, in the embodiment of FIG. 17A2, the cooling fins 380 are oriented in a vertical direction, as shown.

FIG. 17B1 illustrates a configuration wherein the heat exchanger for the conduction rails 310a takes the form of cooling fins 380 in thermal contact with the conduction rails 310a. In this example, the cooling fins 380 are immersed in a forced-air flow of cooling air 381, for example induced by a fan system 382. In the embodiment depicted in FIG. 17B2, the sidewalls of the conduction rails 310a, 310b have a rectangular outer profile, rather than trapezoidal as in FIG. 17B1. Also, the FIG. 17B2 embodiment depicts installation of conduction rails and circuit cards of the type and methods of formation disclosed herein applied to an air-transport-rack (ATR) type chassis. In the ATR-type chassis, a pressurized flow of air is drawn past the horizontally-oriented cooling vanes 380 between the conduction rails 310a, 310b and sidewalls of the chassis.

FIG. 17C1 illustrates a configuration wherein the heat exchanger for the conduction rails 310a takes the form of cooling fins 380 in thermal contact with the conduction rails 310a. In this example, the cooling fins 380 are in thermal contact with a liquid flow of cooling liquid passing through a liquid distribution system 383 and managed by a cooling liquid source 384. In the embodiment depicted in FIG. 17C2, the sidewalls of the conduction rails 310a, 310b have a rectangular outer profile, rather than trapezoidal as in FIG. 17C1. Also, the FIG. 17C2 embodiment depicts installation of conduction rails and circuit cards of the type and methods of formation disclosed herein applied to an air-transport-rack (ATR) type chassis. In the present embodiment, cooling fluid 384a is introduced into the suitably retrofitted ATR-type chassis, and contacts the horizontally-oriented cooling vanes 380 between the conduction rails 310a, 310b and sidewalls of the chassis. The warmed cooling fluid 384b is retrieved, processed, and recirculated by the cooling liquid source 384.

FIG. 17D1 illustrates a configuration wherein the heat exchanger for the conduction rails 310a takes the form of liquid channels 385 formed in or on the conduction rails 310a and in thermal contact with the conduction rails 310a. For example, the liquid channels 385 can be in direct thermal contact with the inner core 211 of the conduction rails 310a. In this example, a liquid flow of cooling liquid passes through the liquid channels 385. Input and output ports 391, 392 for the cooling liquid are provided at a front plate 330 of the chassis in this example. The FIG. 17D2 embodiment depicts installation of conduction rails and circuit cards of the type and methods of formation disclosed herein applied to an air-transport-rack (ATR) type chassis. In the present embodiment, cooling fluid is introduced into the suitably retrofitted ATR-type chassis, and passes through the liquid channels in thermal contact with the conduction rails 310a, 310b between the conduction rails 310a, 310b and sidewalls of the chassis. The warmed cooling fluid is retrieved and processed and recirculated.

FIG. 17E1 illustrates a configuration wherein the heat exchanger for the conduction rails 310a takes the form of a cooling plate which can comprise a single cooling plate or multiple cooling fins 380 in thermal contact with the conduction rails 310a. In this example, the cooling fins 380 are immersed in a jet of liquid spray 386 to induce heat removal by evaporation 387. The FIG. 17E2 embodiment depicts installation of conduction rails and circuit cards of the type and methods of formation disclosed herein applied to an air-transport-rack (ATR) type chassis. In the present embodiment, cooling fluid is introduced into the suitably retrofitted ATR-type chassis in the form of a jet of liquid coolant and is presented to the conduction rails 310a, 310b or cooling vanes on the conduction rails 310, 310b at a location between the conduction rails 310a, 310b and sidewalls of the chassis. Multiple jet nozzles 386 can be employed for this purpose. The warmed cooling fluid is retrieved and processed and recirculated.

FIG. 17F illustrates a configuration wherein the heat exchanger for the conduction rails 310a takes the form of cooling fins 388 in thermal contact with the conduction rails 310a, but positioned on the top panel 350 of the chassis, at a location that is separated from the conduction rails 310a. Heat exchange with the cooling fins 388 on the top panel 350 can take place according to any suitable mechanism, including the mechanisms disclosed herein. This configuration is further compatible with ATR-type chasses.

Figure 17G:
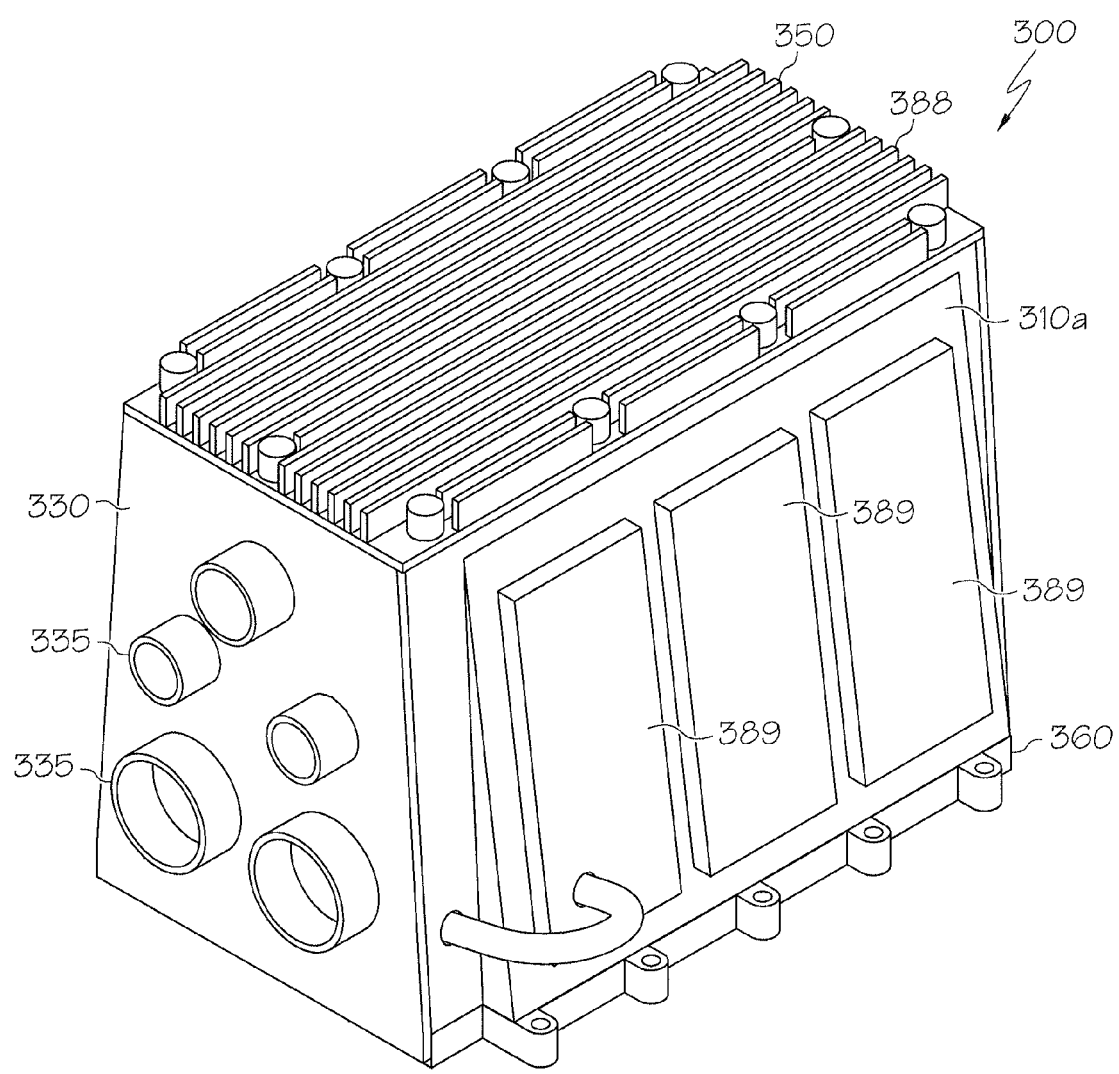

FIG. 17G illustrates a configuration wherein the heat exchanger for the conduction rails 310a takes the form of one or more active cooling elements 389 in thermal contact with the conduction rails 310a. The active cooling elements can comprise, for example, piezoelectric chillers, vapor cycle refrigerators, and other suitable active cooling elements. This configuration is further compatible with ATR-type chasses.

Figure 17H:
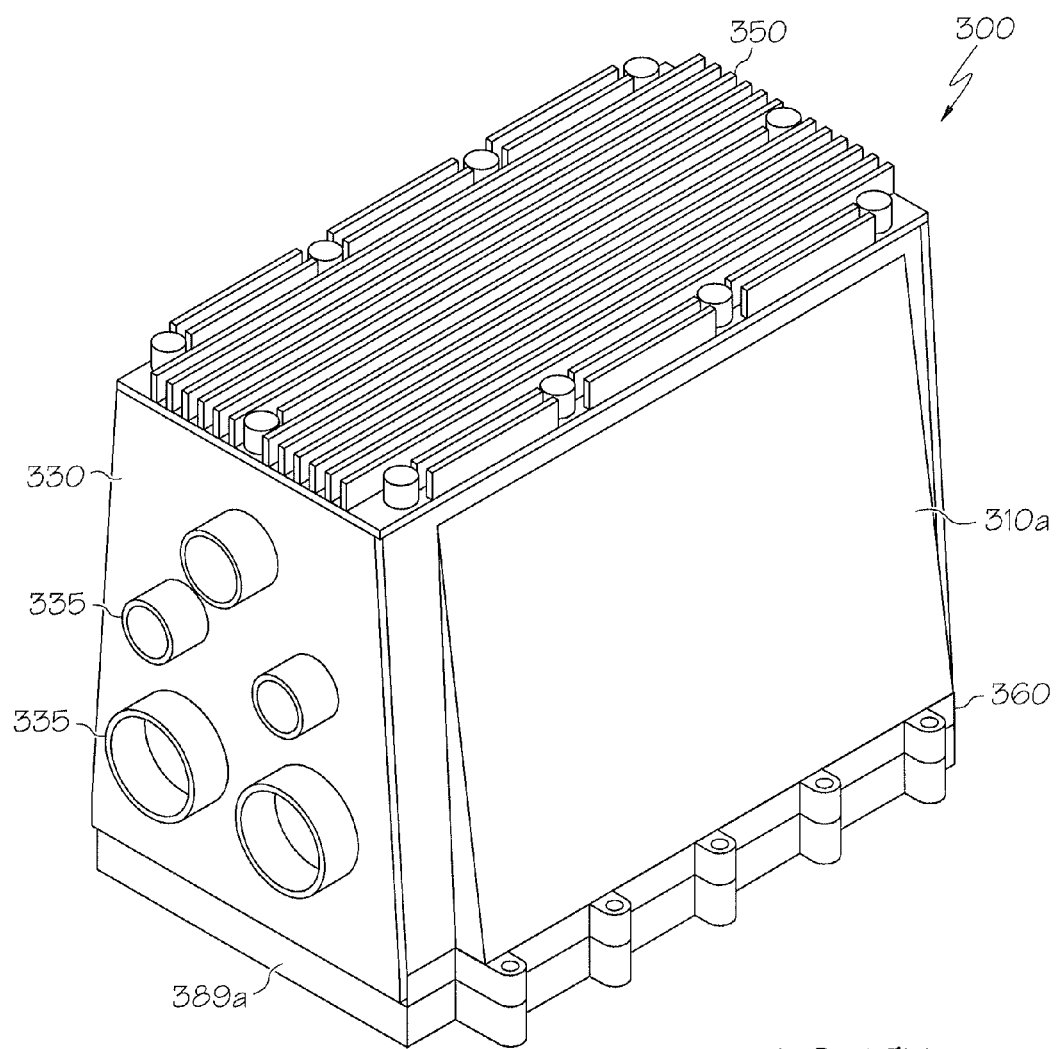

FIG. 17H illustrates a configuration wherein the heat exchanger for the conduction rails 310a takes the form of one or more active cooling elements 389a in thermal contact with the conduction rails 310a. In this example, the active cooling element 389a is in thermal contact with the conduction rails 310a via the base plate 360 of the chassis 300. This configuration is further compatible with ATR-type chasses.

While embodiments of the inventive concept have been particularly shown and described, it will be understood by those skilled in the art that various changes in form and detail may be made herein without departing from the spirit and scope of the inventive concept as defined by the appended claims.

What is claimed is:

1. A circuit card enclosure comprising:
   a backplane including a plurality of connectors;
   first and second conduction rails thermally coupled to a heat exchanger, the first and second conduction rails each comprising an inner body at least partially encapsulated by an outer body, the inner body comprising a thermally conductive material, the outer body comprising a structural material; and
   card slots of the circuit card enclosure defined between opposed card channels of the first and second conduction rails, each card slot constructed and arranged to register an inserted circuit card with at least one of the connectors, the card channels including a thermally conductive region constructed and arranged to thermally interface with a thermal frame of an inserted circuit card, the thermally conductive region of the card channels being thermally coupled to the inner body of the conduction rails.

2. The circuit card enclosure of claim 1 wherein the backplane is thermally coupled to a backplane panel, and wherein the first and second conduction rails are thermally coupled to the heat exchanger via the backplane panel.

3. The circuit card enclosure of claim 2 wherein the inner bodies of the first and second conduction rails extend into the backplane panel to abut an inner surface of the backplane panel.

4. The circuit card enclosure of claim 3 wherein a thermal conduction path is provided between the thermally conductive regions of the card channels and the backplane panel via the inner bodies of the first and second conduction rails.

5. The circuit card enclosure of claim 2 wherein the backplane panel includes first and second inner body inserts that abut first and second inner surface regions of the backplane panel, the first and second backplane panel inner body inserts each comprising a thermally conductive material, and wherein lower surfaces of the inner bodies of the first and second conduction rails are thermally coupled to surfaces of the first and second inner body inserts of the backplane panel.

6. The circuit card enclosure of claim 5 wherein a thermal conduction path is provided between the thermally conductive regions of the card channels and the first and second inner surface regions of the backplane panel via the inner bodies of the first and second conduction rails and the backplane panel inner body inserts of the backplane panel.

7. The circuit card enclosure of claim 2 further comprising a cooling plate coupled to the backplane panel.

8. The circuit card enclosure of claim 7 wherein the cooling plate is conduction-cooled.

9. The circuit card enclosure of claim 7 wherein the cooling plate is air-cooled.

10. The circuit card enclosure of claim 1 wherein the outer body of the first and second conduction rails comprises a thermally conductive material.

11. The circuit card enclosure of claim 1 wherein the thermally conductive material of the inner body of the first and second conduction rails is lighter in weight per unit volume than the thermally conductive material of the outer body of the first and second conduction rails.

12. The circuit card enclosure of claim 1 wherein the thermally conductive material of the inner body is optimized for thermal conductivity and wherein the structural material of the outer body is optimized for structural integrity.

13. The circuit card enclosure of claim 1 wherein the thermally conductive material of the inner bodies of the conduction rails comprises at least one material selected from: graphite, aluminum graphite, carbon fiber, metal matrix composites, advanced ceramics, carbon composites, carbon nanotubes, thermally conductive derivatives, and alloys thereof.

14. The circuit card enclosure of claim 1 wherein the structural material of the outer bodies of the conduction rails comprises at least one material selected from: aluminum, copper, alloys thereof, and metal matrix composites.

15. The circuit card enclosure of claim 1 wherein the conduction rails include internal reinforcements that are attached to inner surfaces of the outer body to reinforce the outer body.

16. The circuit card enclosure of claim 1 wherein the structural material of the outer bodies of the conduction rails comprises a thermally conductive material.

17. The circuit card enclosure of claim 1 wherein the thermally conductive regions of the card channels are constructed and arranged to thermally interface with a thermal frame of a conduction-cooled circuit card assembly (CCA).

18. The circuit card enclosure of claim 1 wherein the card channels are defined between opposed surfaces of neighboring card guide rails that protrude from the first and second conduction rails, at least one of the opposed surfaces including the thermally conductive region of the card channel, portions of the inner bodies of the first and second conduction rails protruding into an inner body portion of the card guide rails.

19. The circuit card enclosure of claim 18 wherein outer portions of the card guide rails are integral with the outer bodies of the respective conduction rails.

20. The circuit card enclosure of claim 18 further comprising a thermal interface material (TIM) at the thermally conductive region of the card channels.

21. The circuit card enclosure of claim 20 further comprising a controlled-volume cavity in the thermally conductive region of the card channels and wherein the TIM is positioned in the controlled-volume cavity.

22. The circuit card enclosure of claim 1 wherein portions of the thermally conductive material of the inner body comprise a material having transverse isotropic thermal properties.

23. The circuit card enclosure of claim 22 wherein the material having transverse isotropic thermal properties is thermally conductive in a planar direction of grains of the material and has reduced thermal conductivity in a vertical direction that is normal to the planar direction.

24. The circuit card enclosure of claim 23 wherein grains of a first portion of the inner body are oriented in a first planar direction, and wherein grains of a second portion of the inner body are oriented in a second planar direction, wherein the second planar direction is different than the first planar direction.

25. The circuit card enclosure of claim 1 wherein the inner body comprises a composite material including a carbon-based matrix and a metal.

26. The circuit card enclosure of claim 25 wherein the carbon-based matrix comprises graphite and wherein the metal comprises aluminum.

27. The circuit card enclosure of claim 25 wherein the inner body has a thermal conduction property that is different from a thermal conduction property of the outer body.

28. The circuit card enclosure of claim 25 wherein the inner body has a mechanical strength property that is different from a strength property of the outer body.

29. The circuit card enclosure of claim 1 wherein the outer body comprises a composite material including a carbon-based matrix and a metal.

30. The circuit card enclosure of claim 29 wherein the carbon-based matrix comprises graphite and wherein the metal comprises aluminum.

31. The circuit card enclosure of claim 1 wherein the heat exchanger comprises cooling fins and wherein heat generated on the circuit cards is removed by natural convection air currents.

32. The circuit card enclosure of claim 1 wherein the heat exchanger comprises cooling fins and wherein heat generated on the circuit cards is removed by the forced air flow.

33. The circuit card enclosure of claim 1 wherein the heat exchanger comprises cooling fins, pipes, or channels, and further comprising a liquid distribution system thermally coupled to the heat exchanger, wherein heat generated on the circuit cards is removed via a liquid flow through the liquid distribution system.

34. The circuit card enclosure of claim 1 wherein the heat exchanger comprises a liquid distribution system thermally coupled to inner body, wherein heat generated on the circuit cards is removed via a liquid flow through the liquid distribution system.

35. The circuit card enclosure of claim 1 wherein the heat exchanger comprises cooling fins and further comprising a spray evaporative system that releases a spray on the cooling fins, wherein heat generated on the circuit cards is removed via spray evaporative cooling.

36. The circuit card enclosure of claim 1 wherein heat exchanger comprises cooling fins that are positioned at a surface of the enclosure other than a surface of the conduction rails.

37. The circuit card enclosure of claim 1 wherein the heat exchanger comprises an active cooling element directly mounted to or coupled to the conduction rails.

38. The circuit card enclosure of claim 1 wherein the heat exchanger comprises one or more cold plates.

* * * * *